US011258448B2

(12) United States Patent
Yu et al.

(10) Patent No.: US 11,258,448 B2
(45) Date of Patent: Feb. 22, 2022

(54) SYSTEMS AND METHODS FOR DIGITAL SYNTHESIS OF OUTPUT SIGNALS USING RESONATORS

(71) Applicant: Mixed-Signal Devices Inc., Irvine, CA (US)

(72) Inventors: Tommy Yu, Orange, CA (US); Avanindra Madisetti, Coto de Caza, CA (US)

(73) Assignee: Mixed-Signal Devices Inc., Irvine, CA (US)

( * ) Notice: Subject to any disclaimer, the term of this patent is extended or adjusted under 35 U.S.C. 154(b) by 0 days.

(21) Appl. No.: 17/074,250

(22) Filed: Oct. 19, 2020

(65) Prior Publication Data

US 2021/0175889 A1    Jun. 10, 2021

Related U.S. Application Data

(63) Continuation of application No. 16/703,580, filed on Dec. 4, 2019, now Pat. No. 10,812,087, which is a
(Continued)

(51) Int. Cl.
*H03L 7/085* (2006.01)
*H03L 7/10* (2006.01)
(Continued)

(52) U.S. Cl.
CPC ............. *H03L 7/085* (2013.01); *G04F 5/04* (2013.01); *G04F 5/10* (2013.01); *G06F 1/022* (2013.01);
(Continued)

(58) Field of Classification Search
CPC ....... H03L 7/085; H03L 7/104; H03L 7/0991; H03L 1/022; H03L 7/18; H03L 7/23;
(Continued)

(56) References Cited

U.S. PATENT DOCUMENTS 5,682,161 A    10/1997  Ribner et al.
5,914,933 A     6/1999  Cimini et al.
(Continued)

FOREIGN PATENT DOCUMENTS

CN        110168930 A     8/2019
EP         3542461 A1     9/2019
(Continued)

OTHER PUBLICATIONS

International Preliminary Report on Patentability for International Application PCT/US2017/062744, Report dated May 21, 2019, dated May 31, 2019, 8 Pgs.
(Continued)

*Primary Examiner* — Arnold M Kinkead
(74) *Attorney, Agent, or Firm* — KPPB LLP

(57) ABSTRACT

Systems and methods for digital synthesis of an output signal using a frequency generated from a resonator and computing amplitude values that take into account temperature variations and resonant frequency variations resulting from manufacturing variability are described. A direct frequency synthesizer architecture is leveraged on a high Q resonator, such as a film bulk acoustic resonator (FBAR), a spectral multiband resonator (SMR), and a contour mode resonator (CMR) and is used to generate pristine signals.

14 Claims, 25 Drawing Sheets

Related U.S. Application Data continuation of application No. 15/470,616, filed on Mar. 27, 2017, now Pat. No. 10,530,372.

(60) Provisional application No. 62/383,922, filed on Sep. 6, 2016, provisional application No. 62/313,521, filed on Mar. 25, 2016.

(51) Int. Cl.

| | | |
|---|---|---|
| H03L 7/099 | (2006.01) | |
| H03B 21/02 | (2006.01) | |
| H04J 3/06 | (2006.01) | |
| G04F 5/04 | (2006.01) | |
| H03L 1/02 | (2006.01) | |
| H03L 7/06 | (2006.01) | |
| H03L 7/197 | (2006.01) | |
| H03L 7/18 | (2006.01) | |
| H03L 7/23 | (2006.01) | |
| G06F 1/02 | (2006.01) | |
| G04F 5/10 | (2006.01) | |

(52) U.S. Cl.
CPC .............. *H03B 21/02* (2013.01); *H03L 1/022* (2013.01); *H03L 1/027* (2013.01); *H03L 7/06* (2013.01); *H03L 7/0991* (2013.01); *H03L 7/104* (2013.01); *H03L 7/18* (2013.01); *H03L 7/1976* (2013.01); *H03L 7/23* (2013.01); *H04J 3/0635* (2013.01)

(58) Field of Classification Search
CPC ......... H03L 7/1976; H03L 1/027; H03L 7/06; H03B 21/02; H04J 3/0635; G04F 5/04; G04F 5/10; G06F 1/022
USPC ...... 327/159, 156, 105; 331/2, 176, 18, 1 A, 331/16, 34, 1 R
See application file for complete search history.

(56) References Cited

U.S. PATENT DOCUMENTS

| | | | |
|---|---|---|---|
| 6,724,249 B1 | 4/2004 | Nilsson | |
| 7,176,820 B1 | 2/2007 | Fuller et al. | |
| 8,294,605 B1 | 10/2012 | Pagnanelli | |
| 8,949,699 B1 | 2/2015 | Gustlin | |
| 10,020,818 B1 | 7/2018 | Yu et al. | |
| 10,367,522 B2 | 7/2019 | Yu et al. | |
| 10,530,372 B1* | 1/2020 | Yu ........................... | H03L 7/23 |
| 10,812,087 B2 | 10/2020 | Yu et al. | |
| 10,840,939 B2 | 11/2020 | Yu et al. | |
| 2001/0022555 A1 | 9/2001 | Lee et al. | |
| 2002/0053986 A1 | 5/2002 | Brooks et al. | |
| 2002/0057214 A1 | 5/2002 | Brooks et al. | |
| 2002/0061086 A1 | 5/2002 | Adachi et al. | |
| 2002/0093442 A1 | 7/2002 | Gupta et al. | |
| 2003/0128143 A1 | 7/2003 | Yap et al. | |
| 2003/0137359 A1 | 7/2003 | Patana et al. | |
| 2003/0174080 A1 | 9/2003 | Brooks et al. | |
| 2003/0179121 A1 | 9/2003 | Gupta et al. | |
| 2003/0227401 A1 | 12/2003 | Yang et al. | |
| 2004/0032355 A1 | 2/2004 | Melanson et al. | |
| 2004/0066321 A1 | 4/2004 | Brooks et al. | |
| 2004/0081266 A1 | 4/2004 | Adachi et al. | |
| 2004/0108947 A1 | 6/2004 | Yang et al. | |
| 2004/0228416 A1 | 11/2004 | Anderson et al. | |
| 2004/0233084 A1 | 11/2004 | Brooks et al. | |
| 2004/0233085 A1 | 11/2004 | Fukuda et al. | |
| 2004/0252038 A1 | 12/2004 | Robinson et al. | |
| 2005/0001750 A1 | 1/2005 | Lo et al. | |
| 2005/0012649 A1 | 1/2005 | Adams et al. | |
| 2005/0030212 A1 | 2/2005 | Brooks et al. | |
| 2005/0057385 A1 | 3/2005 | Gupta et al. | |
| 2005/0062627 A1 | 3/2005 | Jelonnek et al. | |
| 2005/0063505 A1 | 3/2005 | Dubash et al. | |
| 2005/0088327 A1 | 4/2005 | Yokoyama et al. | |
| 2005/0093726 A1 | 5/2005 | Hezar et al. | |
| 2005/0116850 A1 | 6/2005 | Hezar et al. | |
| 2005/0128111 A1 | 6/2005 | Brooks et al. | |
| 2005/0156767 A1 | 7/2005 | Melanson et al. | |
| 2005/0156768 A1 | 7/2005 | Melanson et al. | |
| 2005/0156771 A1 | 7/2005 | Melanson et al. | |
| 2005/0162222 A1 | 7/2005 | Hezar et al. | |
| 2005/0207480 A1 | 9/2005 | Norsworthy et al. | |
| 2005/0237119 A1* | 10/2005 | Irie ......................... | H03L 7/199 331/16 |
| 2005/0266805 A1 | 12/2005 | Jensen et al. | |
| 2005/0285685 A1 | 12/2005 | Frey et al. | |
| 2006/0028364 A1 | 2/2006 | Rivoir et al. | |
| 2006/0038708 A1 | 2/2006 | Luh et al. | |
| 2006/0044057 A1 | 3/2006 | Hezar et al. | |
| 2006/0109153 A1 | 5/2006 | Gupta et al. | |
| 2006/0115036 A1 | 6/2006 | Adachi et al. | |
| 2006/0164276 A1 | 7/2006 | Luh et al. | |
| 2006/0290549 A1 | 12/2006 | Laroia et al. | |
| 2007/0001776 A1 | 1/2007 | Li et al. | |
| 2007/0013566 A1 | 1/2007 | Chuang et al. | |
| 2007/0018866 A1 | 1/2007 | Melanson et al. | |
| 2007/0035425 A1 | 2/2007 | Hinrichs et al. | |
| 2007/0080843 A1 | 4/2007 | Lee et al. | |
| 2007/0126618 A1 | 6/2007 | Tanaka et al. | |
| 2007/0152865 A1 | 7/2007 | Melanson et al. | |
| 2007/0165708 A1 | 7/2007 | Darabi et al. | |
| 2007/0279034 A1 | 12/2007 | Roh et al. | |
| 2008/0062022 A1 | 3/2008 | Melanson et al. | |
| 2008/0062024 A1 | 3/2008 | Maeda et al. | |
| 2008/0100486 A1 | 5/2008 | Lin et al. | |
| 2008/0180166 A1 | 7/2008 | Gustat et al. | |
| 2008/0191713 A1 | 8/2008 | Hauer et al. | |
| 2008/0198050 A1 | 8/2008 | Akizuki et al. | |
| 2008/0211588 A1 | 9/2008 | Frey et al. | |
| 2008/0272945 A1 | 11/2008 | Melanson et al. | |
| 2008/0272946 A1 | 11/2008 | Melanson et al. | |
| 2009/0083567 A1 | 3/2009 | Kim et al. | |
| 2009/0096649 A1 | 4/2009 | Ferri et al. | |
| 2009/0220219 A1 | 9/2009 | McLeod et al. | |
| 2009/0309774 A1 | 12/2009 | Hamashita et al. | |
| 2010/0045498 A1 | 2/2010 | Liu et al. | |
| 2010/0052960 A1 | 3/2010 | Lakdawala et al. | |
| 2010/0074368 A1 | 3/2010 | Karthaus et al. | |
| 2010/0164773 A1 | 7/2010 | Clement et al. | |
| 2010/0214143 A1 | 8/2010 | Nakamoto et al. | |
| 2010/0219999 A1 | 9/2010 | Oliaei et al. | |
| 2010/0225517 A1 | 9/2010 | Aiba et al. | |
| 2010/0283648 A1 | 11/2010 | Niwa et al. | |
| 2010/0295715 A1 | 11/2010 | Sornin et al. | |
| 2011/0006936 A1 | 1/2011 | Lin et al. | |
| 2011/0050472 A1 | 3/2011 | Melanson et al. | |
| 2011/0149155 A1 | 6/2011 | Lin et al. | |
| 2011/0299642 A1 | 12/2011 | Norsworthy et al. | |
| 2012/0063519 A1 | 3/2012 | Oliaei et al. | |
| 2012/0161864 A1 | 6/2012 | Lee et al. | |
| 2012/0194369 A1 | 8/2012 | Galton et al. | |
| 2012/0200437 A1 | 8/2012 | Moue et al. | |
| 2012/0242521 A1 | 9/2012 | Kinyua et al. | |
| 2012/0275493 A1 | 11/2012 | Fortier et al. | |
| 2012/0280843 A1 | 11/2012 | Tsai et al. | |
| 2012/0286982 A1 | 11/2012 | Kajita et al. | |
| 2013/0068019 A1 | 3/2013 | Takase et al. | |
| 2013/0099949 A1 | 4/2013 | Wagner et al. | |
| 2013/0169460 A1 | 7/2013 | Obata et al. | |
| 2013/0259103 A1 | 10/2013 | Jensen et al. | |
| 2014/0028374 A1 | 1/2014 | Zare-Hoseini et al. | |
| 2014/0035769 A1 | 2/2014 | Rajaee et al. | |
| 2014/0070969 A1 | 3/2014 | Shu | |
| 2014/0113575 A1 | 4/2014 | Mitani et al. | |
| 2014/0139293 A1 | 5/2014 | Tsangaropoulos et al. | |
| 2014/0286467 A1 | 9/2014 | Norsworthy et al. | |
| 2014/0307825 A1 | 10/2014 | Ostrovskyy et al. | |
| 2014/0320325 A1 | 10/2014 | Muthers et al. | |
| 2014/0368365 A1 | 12/2014 | Quiquempoix et al. | |
| 2015/0002325 A1 | 1/2015 | Lin | |
| 2015/0009054 A1 | 1/2015 | Ono et al. | |

(56) References Cited

U.S. PATENT DOCUMENTS

| | | |
|---|---|---|
| 2015/0036766 A1 | 2/2015 | Elsayed et al. |
| 2015/0061907 A1 | 3/2015 | Miglani |
| 2015/0084797 A1 | 3/2015 | Singh et al. |
| 2015/0109157 A1 | 4/2015 | Caldwell et al. |
| 2015/0116138 A1 | 4/2015 | Li et al. |
| 2015/0146773 A1 | 5/2015 | Ma et al. |
| 2015/0171887 A1 | 6/2015 | Okuda |
| 2015/0341159 A1 | 11/2015 | Norsworthy et al. |
| 2015/0349794 A1 | 12/2015 | Line |
| 2016/0013805 A1 | 1/2016 | Maehata |
| 2016/0049947 A1 | 2/2016 | Adachi |
| 2016/0050382 A1 | 2/2016 | Rizk et al. |
| 2016/0065236 A1 | 3/2016 | Ahmed et al. |
| 2016/0149586 A1 | 5/2016 | Roh et al. |
| 2016/0336946 A1 | 11/2016 | Ho et al. |
| 2016/0344404 A1 | 11/2016 | Miglani et al. |
| 2016/0359499 A1 | 12/2016 | Bandyopadhyay |
| 2016/0373125 A1 | 12/2016 | Pagnanelli et al. |
| 2017/0033801 A1 | 2/2017 | Lo et al. |
| 2017/0041019 A1 | 2/2017 | Miglani et al. |
| 2017/0045403 A1 | 2/2017 | Zanbaghi et al. |
| 2017/0093407 A1 | 3/2017 | Kim et al. |
| 2017/0102248 A1 | 4/2017 | Maurer et al. |
| 2017/0134055 A1 | 5/2017 | Ebrahimi et al. |
| 2017/0163295 A1 | 6/2017 | Talty et al. |
| 2017/0170839 A1 | 6/2017 | Zhao et al. |
| 2017/0170840 A1 | 6/2017 | Zhao |
| 2017/0184645 A1 | 6/2017 | Sawataishi |
| 2017/0222652 A1 | 8/2017 | Adachi |
| 2017/0222658 A1 | 8/2017 | Miglani et al. |
| 2017/0250662 A1 | 8/2017 | Cope et al. |
| 2017/0276484 A1 | 9/2017 | Marx et al. |
| 2017/0288693 A1 | 10/2017 | Kumar et al. |
| 2018/0145700 A1 | 5/2018 | Yu et al. |
| 2019/0356329 A1 | 11/2019 | Yu et al. |
| 2020/0106448 A1 | 4/2020 | Yu et al. |

FOREIGN PATENT DOCUMENTS

| | | |
|---|---|---|
| WO | 2016063038 A1 | 4/2016 |
| WO | 2016063038 A4 | 7/2016 |
| WO | 2018094380 A1 | 5/2018 |

OTHER PUBLICATIONS

International Search Report and Written Opinion for International Application No. PCT/US2017/062744, Search completed Jan. 17, 2018, dated Feb. 5, 2018, 13 Pgs.

Aigner et al., "Advancement of MEMS into RF-Filter Applications", International Electron Devices Meetings, IEDM '02, Dec. 8-11, 2002, pp. 897-900.

Lam, "A Review of the Recent Development of MEMS and Crystal Oscillators and Their Impacts on the Frequency Control Products Industry", Invited Paper, 2008 IEEE International Ultrasonics Symposium, Beijing, Nov. 2-5, 2008, 11 pages.

Piazza et al., "Piezoelectric Aluminum Nitride Vibrating Contour-Mode MEMS Resonators", Journal of Microelectromechanical Systems, Dec. 2006. vol. 15, No. 6, pp. 1406-1418.

Extended European Search Report for European Application No. 17872454.8, Search completed May 25, 2020, dated Jun. 4, 2020, 15 Pgs.

Majd et al., "Bandwidth enhancement in delta sigma modulator transmitter using low complexity time-interleaved parallel delta sigma modulator", AEU—International Journal of Electronics and Communications, Jul. 2015, vol. 69, No. 7, pp. 1032-1038.

International Preliminary Report Patentability for International Application PCT/US2017/062744, Report dated May 21, 2019, dated May 31, 2019, 8 Pgs.

\* cited by examiner

SYSTEMS AND METHODS FOR DIGITAL SYNTHESIS OF OUTPUT SIGNALS USING RESONATORS

CROSS-REFERENCE TO RELATED APPLICATIONS

The current application is a continuation of U.S. patent application Ser. No. 16/703,580, filed Dec. 4, 2019, entitled "Systems and Methods for Digital Synthesis of Output Signals Using Resonators" to Yu et al., which is a continuation of U.S. patent application Ser. No. 15/470,616, filed Mar. 27, 2017 and issued as U.S. Pat. No. 10,530,372, entitled "Systems and Methods for Digital Synthesis of Output Signals Using Resonators" to Yu et al., which claims priority under 35 U.S.C. 119(e) to U.S. Provisional Patent Application Ser. No. 62/313,521, entitled "Systems and Methods for Digital Synthesis of Output Signals Using Resonators", filed Mar. 25, 2016 and U.S. Provisional Patent Application Ser. No. 62/383,922, entitled "PLL Architecture with a High Q/High Frequency Resonator", filed Sep. 6, 2016, the disclosures of which are incorporated herein by reference in their entireties.

FIELD OF THE INVENTION

The present invention relates to digital synthesis of an output signal using an input frequency generated from a resonator. Furthermore, the present invention relates to synthesizing digital amplitude values for an output clock signal that adjust for variations in temperature and resonant frequencies of different resonators.

BACKGROUND

The phase locked loop (PLL) has been widely used in communication applications. PLLs have been used to recover a signal from a noisy communication channel, generate a stable frequency at multiples of an input frequency, and for demodulating a signal. FIG. 1 is an example of a PLL block diagram. The PLL 100 includes a phase detector (PD) 105, loop filter (LF) 110, and voltage controlled oscillator (VCO) 115. The phase detector 105 compares the phase of a periodic input signal against the phase of the VCO 115 signal; the output of the PD 105 is a measure of the phase error between its two inputs. The error voltage is then filtered by the loop filter 110, whose output is a control voltage that is applied to the VCO 115.

The control voltage changes the VCO frequency in a direction that reduces the phase error between the input signal and the VCO. When the loop is locked, the control voltage sets the average frequency of the VCO to be the same as the average frequency of the input signal. Traditionally, the integrated on-chip voltage controlled oscillator (VCO) has been implemented as L-C tank circuitry. Due to low Q of the on-chip inductor, the VCO phase noise may be limited. An off-chip high Q device such as a crystal may be used as a reference to reduce the overall phase noise of the output.

SUMMARY OF THE INVENTION

The above and other problems are solved and an advance in the art is made by systems and methods for digital synthesis of output signals using resonators in accordance with some embodiments of the invention. In accordance with some embodiments of an invention, a direct frequency synthesizer is configured in the following manner. A high speed resonator generates a frequency signal. An oscillator receives the frequency signal from the high speed resonator and generates an output signal. A clock generator receives the output signal of the oscillator and generates a clock signal from the output signal. A controller generates a frequency control word describing a desired output digital signal and direct digital frequency synthesizer receives the clock signal and the frequency control word and generates a desired digital output signal based on the clock signal and frequency control word.

In accordance with some embodiments of the invention, a high speed digital to analog converter in the synthesizer receives the output signal from the oscillator and the desired digital output signal from the direct digital frequency synthesizer and outputs an analog signal based on the desired digital output signal.

In accordance with many embodiments of the invention, frequency compensation circuitry generates a frequency compensation value to adjust for errors in the frequency signal generated by the high speed resonator and adds the frequency compensation value to the frequency control word. In accordance with some of these embodiments, the frequency compensation circuitry includes a temperature sensor that measure an operating temperature and the frequency compensation circuitry uses the operating temperature to calculate a correct amplitude value for particular time period to adjust the frequency compensation value. In accordance with a number of embodiments, the frequency compensation circuitry includes frequency offset correction circuitry that accounts for resonant frequency offsets in the frequency signal generated by the high speed resonator due to properties of the resonator and provides frequency offset information to the frequency compensation circuitry to generate the frequency compensation value.

In accordance with some embodiments, the frequency compensation circuitry includes a non-volatile memory that stores different output signals that may be generated using the direct digital synthesizer that is used in generating the frequency compensation value. In accordance with some of these embodiments, the non-volatile memory outputs an initial frequency error, process information, and a preset frequency to the frequency compensation circuitry. In accordance with many embodiments, the frequency compensation frequency circuitry includes an analog to digital converter that receives the clock signal from the clock generator and a voltage controlled oscillator signal and generates a frequency adjustment value based on the voltage control oscillator signal. Wherein the frequency adjustment value is used to generate the frequency compensation value.

In accordance with some embodiments the high speed resonator is a resonator selected from the group consisting of a bulk acoustic wave (BAW) resonator, a film bulk acoustic resonator (FBAR), a spectral multiband resonator (SMR), and a contour mode resonator (CMR).

In accordance with some embodiments of an invention, a phase lock loop that receives a reference signal, outputs a high frequency clock signal and feeds back an error correction signal for adding to the reference signal is configured in the following manner. A high frequency oscillator receives a high frequency signal and generates a reference clock signal and a low frequency oscillator receives the low frequency signal and generates a stable clock signal. A frequency ratio estimator determines a ratio between the reference clock signal and the stable clock signal. A fractional N divider receives a signal indicating the ratio between the reference clock signal and stable clock signal and an output signal of the PLL and generates an error feedback correction based upon the ratio of the reference clock signal to the stable clock signal.

In accordance with some embodiments, a high frequency resonator generates the high frequency signal and provides the high frequency signal to the oscillator.

In accordance with many embodiments, the high speed resonator is a resonator selected from the group consisting of a bulk acoustic wave (BAW) resonator, a film bulk acoustic resonator (FBAR), a spectral multiband resonator (SMR), and a contour mode resonator (CMR). In accordance with various embodiments, a crystal resonator that generates a low frequency signal and provides the low frequency signal to the low frequency oscillator. In accordance with a number of embodiments, the high frequency clock signal output by the phase locked loop has a frequency that is N times a frequency of the stable clock signal.

In accordance with some embodiments, the phase lock loop includes a delta sigma modulator that receives the output from the frequency ratio estimator and generates a control signal for the fractional N divider. In accordance with a number of embodiments, the phase lock loop also includes a phase detector that receives the reference clock signal and the error correction signal and generates a corrected reference clock signal; a loop filter that receive the corrected reference clock signal and outputs a control signal; and a voltage controlled oscillator that receives the control signal from the loop filter and generates a high frequency clock signal.

DETAILED DESCRIPTION

Turning now to the drawings, systems and methods for digital synthesis of an output signal using a frequency generated from a resonator and computing amplitude values that take into account temperature variations and resonant frequency variations resulting from manufacturing variability are described. In accordance with some embodiments of the invention, a direct frequency synthesizer architecture is leveraged using a high Q resonator, such as a film bulk acoustic resonator (FBAR), a spectral multiband resonator (SMR), and/or a contour mode resonator (CMR).

Figure 1:
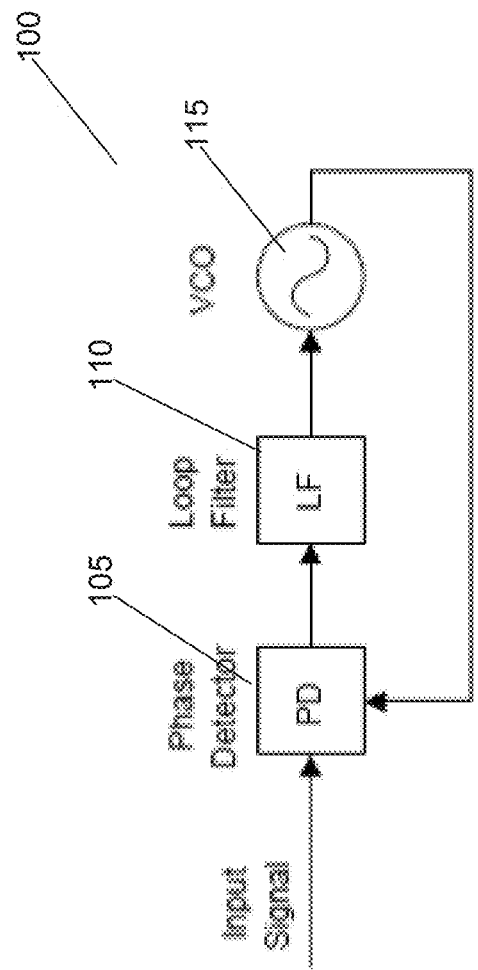
FIG. 1 illustrates an example of a PLL block diagram.
Figure 2:
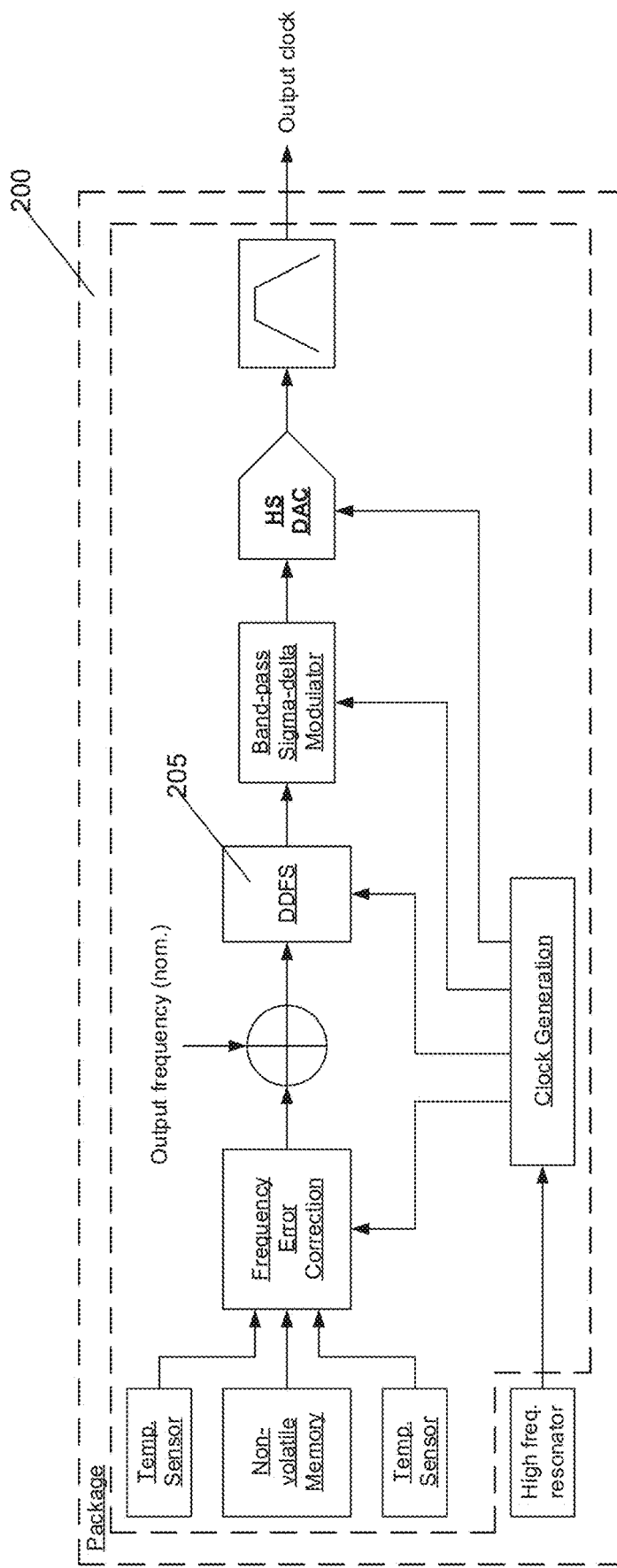
FIG. 2 illustrates a circuit diagram of a direct frequency synthesizer architecture in accordance with an embodiment of the invention.

An example of a circuit diagram of a direct frequency synthesizer architecture in accordance with an embodiment of the invention is illustrated in FIG. 2. In FIG. 2, the output of a direct frequency synthesizer 200 is generated by a direct digital frequency synthesizer (DDFS) 205. In accordance with some embodiments, the output frequency may be controlled by a frequency control word (FCW) provided to the DDFS 205. In accordance with many embodiments, the frequency synthesizer 200 is equivalent to a VCO and can be used in a PLL for clock generation and/or jitter attenuation applications. As will be described below, a direct frequency synthesizer block in accordance with various embodiments of this invention may be used for frequency and phase tracking.

A direct frequency synthesizer in accordance with some embodiments of the invention may provide a programmable oscillator. The programmable oscillator may be used to replace many existing standard crystal and quartz based oscillators providing numerous benefits including, but not limited to, a significant cost savings. In particular, the programmable oscillator may be used to replace many of the existing high performance crystal oscillators (XO) and voltage controlled oscillators (VCXO) available on the market.

The programmable frequency of the programmable oscillator provided by a direct frequency synthesizer in accordance with a number of embodiments of the invention may range from 1 MHz to 2 GHz (or higher) and be programmable with a frequency control word (FCW), which can be at least 32 bits in length. The frequency of the programmable oscillator provided by a direct frequency synthesizer in accordance with a number of embodiments of the invention may be factory programmable as a single frequency and/or limited to multiple selectable frequencies. In some embodiments, the programmable oscillator may be inter-integrated circuit (I2C) programmable and/or programmable using any other appropriate interface. In certain embodiments, the programmable frequency may be voltage controlled. The programmable oscillator may have less than 100 fs Jitter, integrated from 12 KHz-20 MHz, and have a +/−10 ppm frequency drift, with operating range in −40 to 85 degrees Celsius.

Furthermore, a programmable oscillator provided by a direct frequency synthesizer in accordance with some of embodiments of the invention may provide ultra-low phase noise (e.g., <=50 fs. Integrated from 12 KHz to 20 MHz). The programmable oscillator may have a single voltage supply (e.g., 3.3V, 2.5V, or 1.8V), and use an industry-standard package (e.g., 5×7, 3.2×5). As can readily be appreciated, the specific characteristics of a programmable oscillator provided by a direct frequency synthesizer in accordance with some of embodiments of the invention are not limited to any specific characteristics and can be determined based upon the requirements of specific applications in accordance with embodiments of the invention.

Figure 3:
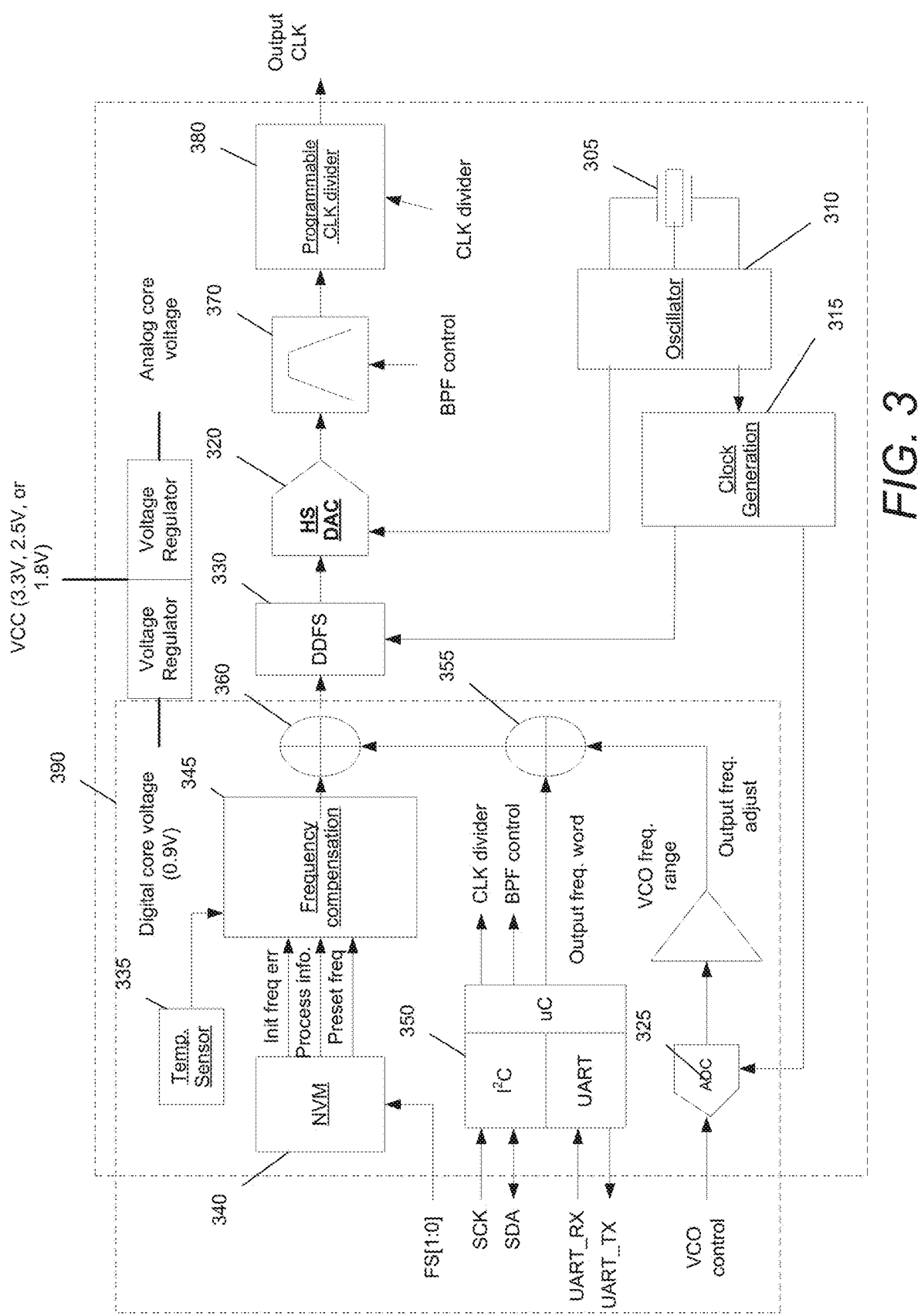
FIG. 3 illustrates a programmable oscillator that digitally synthesizes an output signal based on a frequency generated using a (BAW) resonator in accordance with an embodiment of the invention.

A more detailed example of a programmable oscillator provided by a direct frequency synthesizer in accordance with an embodiment of this invention that digitally synthesizes an output signal based on a frequency generated using a BAW resonator is illustrated in FIG. 3.

In particular, FIG. 3 illustrates a circuit diagram of a programmable oscillator 300, including the various components that may be used to generate a pristine output signal, such as a sinusoidal waveform, using digital synthesis to compute amplitude values of the digital signal for the particular frequency. As is discussed further below, the rate of the output of the programmable oscillator is determined by the resonant frequency of the BAW resonator, which typically varies between BAW resonators due to manufacturing tolerances and/or based upon temperature. The programmable oscillator 300 includes a bulk acoustic wave (BAW) resonator 305 that resonates in a frequency range of roughly 100 MHz to 10 GHz. In accordance with various other embodiments, BAW resonator 305 may be replaced by other high frequency resonators including, but not limited to, a film bulk acoustic resonator (FBAR), a spectral multiband resonator (SMR), and a contour mode resonator (CMR).

Thin film bulk acoustic resonators were first introduced in 1980 with a zinc oxide dielectric. See e.g., T. Grudkowski, J. Black, T. Reeder, D E Cullen, R A, "Fundamental-mode VHF/UHF miniature acoustic resonators and filters on silicon", Applied Physics Lett., v. 37 1980 pp. 993-995. Lakin et al. published a compelling paper in 1982 that both highlighted the potential for thin film BAW devices and also championed the use of AlN as the piezoelectric. See e.g., K. M. Lakin, J. Wang, G. Kline, A. Landin, Y. Chen, J. Hunt, "Thin Film Resonators and Filters", Ultrasonics Symp., 1982, pp. 466-475. In 2001, Agilent introduced the first commercially available PCS duplexer based on FBAR. See e.g., R. Ruby, P. Bradley, J. Larson, Y. Oshmyansky, "PCS 1900 MHz Duplexer Using Thin Film Bulk Acoustic Resonator (FBARs)", Electron. Lett. 35, 1999, pp. 794-795. SMR-BAW devices were first introduced by TFR Inc. and were demonstrated in high volumes by Infineon. See e.g., R. Aigner, J. Ella, H.-J. Timme, L. Elbrecht, W. Nessler and S. Marksteiner, "Advancement of MEMS into RF-Filter Applications", Proc. IEEE, IEDM, 2002. In 2006, Piazza introduced the AlN contour-mode resonator (CMR) technology. See e.g., G. Piazza, P. J. Stephanou, and A. P. Pisano, "Piezoelectric aluminum nitride vibrating contour-mode MEMS resonators," J. Micro-electromech. Syst., vol. 15, no. 6, pp. 1406-1418, December 2006.

During the manufacture of BAW resonators, the physical properties of the resonators may be slightly different between different resonators due to limitations in the manufacturing tools and processes (e.g., atomic level variations in size, thickness, among other factors), and these differences may cause slight variations in the resonant frequencies of the resonators within a certain threshold of error (e.g., plus or minus 10% difference in resonant frequencies may be experienced between different resonators of a same type). For example, a first BAW resonator may generate a resonant frequency of 9.9 GHz and a second BAW resonator manufactured using the same process may generate a resonant frequency of 10 GHz as a result of the particular unique physical properties of each of the resonators since it may be difficult to manufacture two absolutely identical resonators.

In particular, the resonance frequency of a BAW may be determined by the thickness of a piezoelectric layer and neighboring layers of material in the BAW. The required tolerance for the resonant frequency is generally approximately ±0.1% for typical mobile phone filters. The frequency tolerance translates into a thickness tolerance in the same range for the piezo layer and adjacent electrode layers. These extreme thickness tolerances may not be met by standard tools for semiconductor processes, which typically offer 5% accuracy. Even if the run-to-run variations can be optimized to meet a more stringent specification, maintaining thickness uniformity across the wafer is still a problem. Thus, different manufactured BAW resonators will generally have slight differences in their output frequency. This difference in output frequencies between BAW resonators may need to be calibrated in order to minimize the effects of noise and increase the accuracy of an output signal being synthesized using the BAW resonator.

Accordingly, many embodiments of a programmable oscillator are able to determine particular calibration requirements for the resonant frequency of each particular BAW resonator, and to digitally compensate the frequency in order to allow the programmable oscillator to generate a pristine output signal.

In particular, many embodiments of the programmable oscillator may determine the particular resonant frequency of a particular BAW resonator, and compute the amplitude of the digital signal based on the particular determined resonant frequency generated by the particular BAW resonator that is being utilized within the programmable oscillator. In some embodiments, the particular resonant frequency generated by a particular BAW resonator may be determined during a calibration stage of the programmable oscillator and stored for subsequent use in computing amplitude values of the sinusoidal output signal relative to the particular frequency.

Thus, the computed values may vary for programmable oscillators that use different BAW resonators as these values are calculated based on the particular characteristics of the BAW resonator being used within the programmable oscillator.

Figure 5:
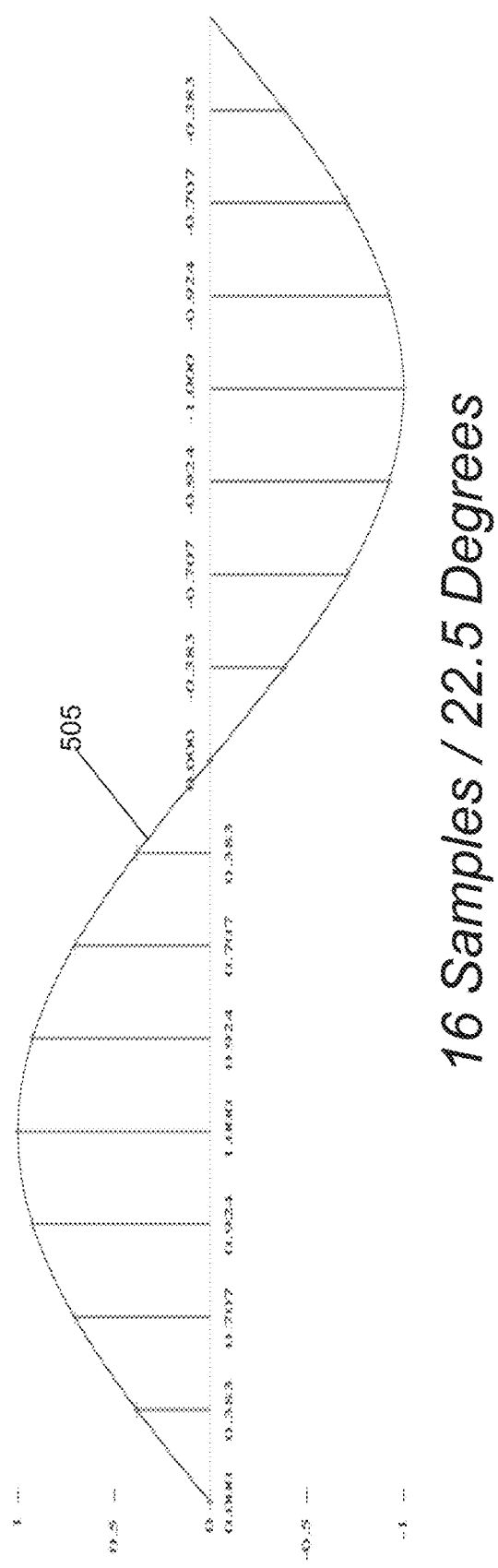
FIG. 5 illustrates a graph that depicts the manner in which a high speed digital to analog converter can be driven by different BAW resonators having different resonant frequencies to generate the same output frequency in accordance with an embodiment of the invention.
Figure 5:
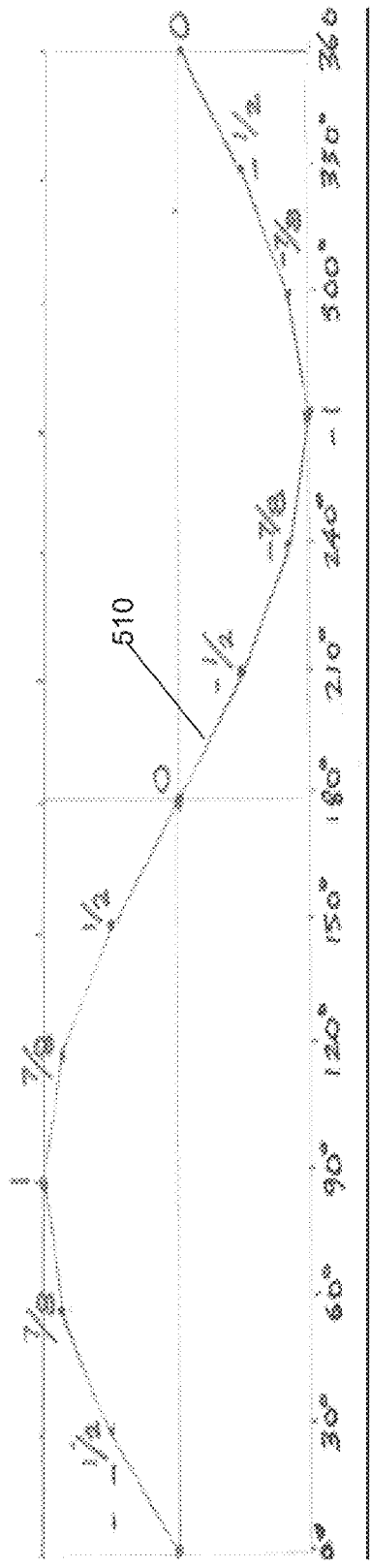

The manner in which a high speed digital to analog converter can be driven by different BAW resonators having different resonant frequencies to generate the same output frequency in accordance with an embodiment of the invention is illustrated in FIG. 5. FIG. 5 illustrates an example of generating an output signal using two different BAW resonators 505 and 510 that resonate at two different resonant frequencies. In particular, this example provides a simplified schematic of the different time periods of the two different BAW resonators being used to sample a sinusoidal wave. In the top example 505, a BAW resonator has a resonant frequency that can be used to generate 16 samples (i.e. 16 changes in output amplitude of a digital to analog converter) over a sinusoidal wave cycle. The bottom example 510 illustrates a BAW resonator that has a resonant frequency that can be used to generate 12 samples over the same sinusoidal wave cycle. The difference in sampling rates between examples 505 and 510 is due to slight variation in the resonant frequencies of the different BAWs that cause the resonators to use different time periods between each sample. Thus, in order to compensate for the variation in the period between sampling for the different BAW resonators, a programmable oscillator in accordance with some embodiments of the invention may generate different frequency compensation values based on the particular frequency of the resonator being used within the programmable oscillator. A programmable oscillator in accordance with many embodiments of the invention may also take into consideration various other factors in computing the digital amplitude value of the output signal, including the temperature of the sensor, as is discussed further below.

Returning to FIG. 3, the BAW resonator 305 generates a frequency signal that is input to an oscillator circuit 310. The oscillator circuit 310 outputs a signal to a high speed digital to analog converter (HS DAC) 320, and a signal to a clock generation circuit 315.

The clock generation circuit 315 generates a clock signal that is output to an analog to digital converter 325 and a direct digital frequency synthesizer circuit (DDFS) 330. The DDFS circuit 330 may include lookup tables that store sine and cosine values. Furthermore, a control word may be used to set the output frequency of DDFS circuit 330 in accordance with some embodiments. The DDFS circuit 330 may provide a very high tuning range as the DDFS is used to set the frequency. Furthermore, the programmable oscillator 300 is able to provide low phase noise with the ability to tune the output frequency of the programmable oscillator 300. In accordance with some embodiments, the DDFS circuit 330 may use logic and memory to digitally construct the desired output signal, and the HS DAC 320 may be used to convert the DDFS circuit 330 output signal from the digital to the analog domain. Therefore, the DDFS method of constructing a signal may be almost entirely digital, and the precise amplitude, frequency, and phase may be known and controlled at all times.

The various components of the frequency compensation circuitry 390 include the ADC 325, a temperature sensor 335, a non-volatile memory (NVM) 340, frequency compensation circuitry 345, an I2C and microcontroller (μC) 350, and DDFS circuit 330. In accordance with many embodiments, the frequency compensation circuitry may be used to compute and synthesize the digital amplitude values of the output signal that are then provided to the HS DAC 320 at each clock cycle.

In programmable oscillator 300, the NVM 340 stores calibration values used for adjusting the amplitude values of the digital signal for different temperatures being sensed by temperature sensor 335. In accordance with some embodiments, the NVM 340 may also store look-up tables for different output signals that may be generated by the programmable oscillator 300 including, but not limited to, sine values for a sinusoidal wave, cosine values for a cosine output signal, square wave values for a square wave output signal, and values for various other types of output signals that may be generated as appropriate to the requirements of specific applications.

In accordance with many embodiments, a preliminary calibration process may be performed by programmable oscillator 300 in order to determine the frequency variations that may occur with variations in temperature, as described in detail below. Furthermore, the frequency control word may be adjusted based upon the temperature in order to achieve the desired output frequency in accordance with a number of embodiments.

The I2C 350 programmable interface receives configuration values related to the desired output frequency including, but not limited to, a CLK divider value, a BPF control, and an output frequency word. The configuration and operation of the programmable oscillator 300 may be controlled by reading and writing to the RAM space using the I2C interface. The I2C bus may include a bidirectional serial data line (SDA) and a serial clock input (SCK) in accordance with several embodiments.

The ADC 325 receives a control input for a voltage-controlled oscillator (VCO) and a clock signal from clock generation 315. The ADC 325 then outputs a frequency adjustment value to adder 355 to be combined with the output frequency word. The output of the adder 355 is provided to a second adder 360 to be combined with a frequency compensation value received from frequency compensation circuitry 345. The output of adder 360 may be provided to DDFS circuit 330.

In order to compute the particular digital amplitude value to provide to the HS DAC 320, the various components of the frequency compensation circuitry 390 of the programmable oscillator 390 use calibration values stored in the NVM 340 for different temperatures, and a current temperature provided by temperature sensor 335 in order to compute the correct amplitude value for a particular time period. The NVM 340 outputs an initial frequency error, process information, and a preset frequency to frequency compensation circuitry 345.

Furthermore, frequency compensation circuitry 390 may compute a frequency compensation value for each of the corresponding time periods being input by clock generation 305 in accordance with many embodiments. As described above, the frequency compensation value may be adjusted to account for different BAW resonator frequencies in accordance with a number of embodiments. Based on the frequency compensation, DDFS circuit 330 determines the particular amplitude value to provide HS DAC 320 in order to digitally synthesize the sinusoidal wave.

The HS DAC 320 converts digital values to an analog signal at a sampling frequency (Fs) applied to the HS DAC clock. HS DAC 320 may read an input digital amplitude value at each clock tick received from the oscillator and convert the digital value to an analog output value in accordance with some embodiments. In accordance with many embodiments, the series of amplitude values being input to the HS DAC 320 at each time period will result in the HS DAC 320 outputting analog values for an output signal that is a pristine sinusoidal wave. As illustrated in FIG. 5, the amplitude values for clock ticks of the resonator shown in example 510 without calibration of the amplitude values for temperature variation are as follows: the first clock tick is 0.383, the $2^{nd}$ clock tick is 0.707, the third clock tick is 0.924, and so forth until the 16th clock tick at 0 for a complete sinusoidal wave cycle. Likewise, example 510 shows the amplitude values for clock ticks of a resonant frequency that corresponds to 12 samples per time period are as follows: the amplitude value for the first clock tick is 0.5, the second clock tick is 0.875, the third clock tick is 1, and so forth till the $12^{th}$ clock tick at 0 for a complete sinusoidal wave cycle.

The output of HS DAC 320 is provided to a tunable bandpass filter 370 and is subsequently provided to a programmable CLK divider 380. The tunable bandpass filter 370 and CLK divider 380 may be used to tune out the image and to output the clock signal.

Although FIG. 3 illustrates a particular circuit diagram for a programmable oscillator that includes various components, including temperature sensor and frequency compensation circuitry, other components may be used and certain components illustrated may be removed as appropriate to the requirements of specific applications in accordance with embodiments of the invention.

Figure 4:
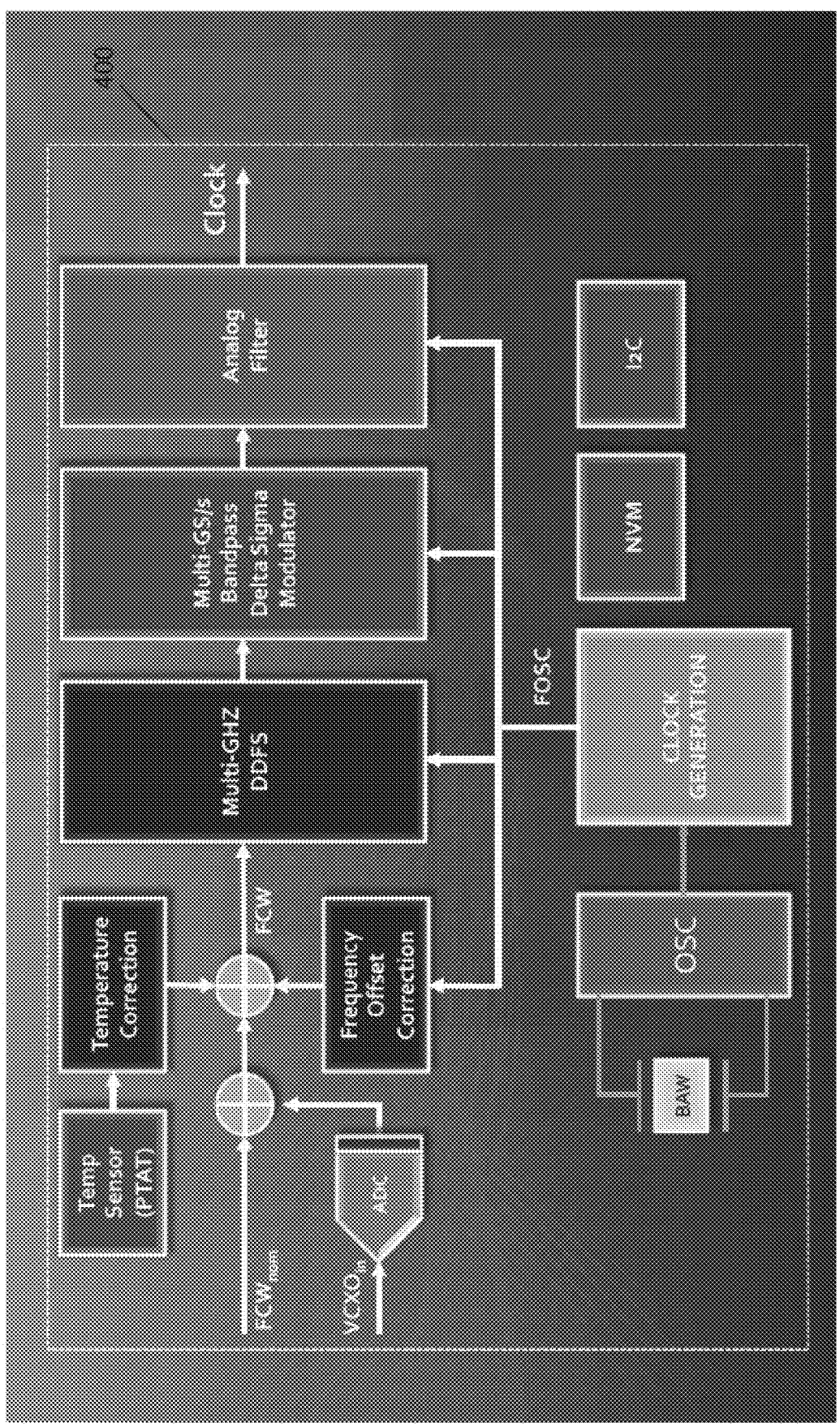
FIG. 4 illustrates a circuit diagram for a frequency synthesizer in accordance with an embodiment of the invention.

Another more simplified circuit diagram for a programmable oscillator provided by a direct frequency synthesizer, similar to the circuit diagram illustrated in FIG. 3 in accordance with an embodiment of the invention is illustrated in FIG. 4. In particular, FIG. 4 illustrates a programmable oscillator 400 that generates an output signal based on a frequency generated by a BAW resonator. The programmable oscillator 400 includes a temperature correction circuitry and the frequency offset correction circuitry similar to those components described above with reference to FIG. 3, which are provided to a multi-GHz DDFS, which passes through a Multi-GS/s Bandpass Delta Sigma Modulator and an analog filter to generate a clock signal. Although FIG. 4 illustrates a programmable oscillator implemented using a particular set of components, various components may be used and/or removed from the architecture as appropriate to the requirements of specific applications in accordance with embodiments of the invention.

Packaging and Resonator Selection

Figure 6:
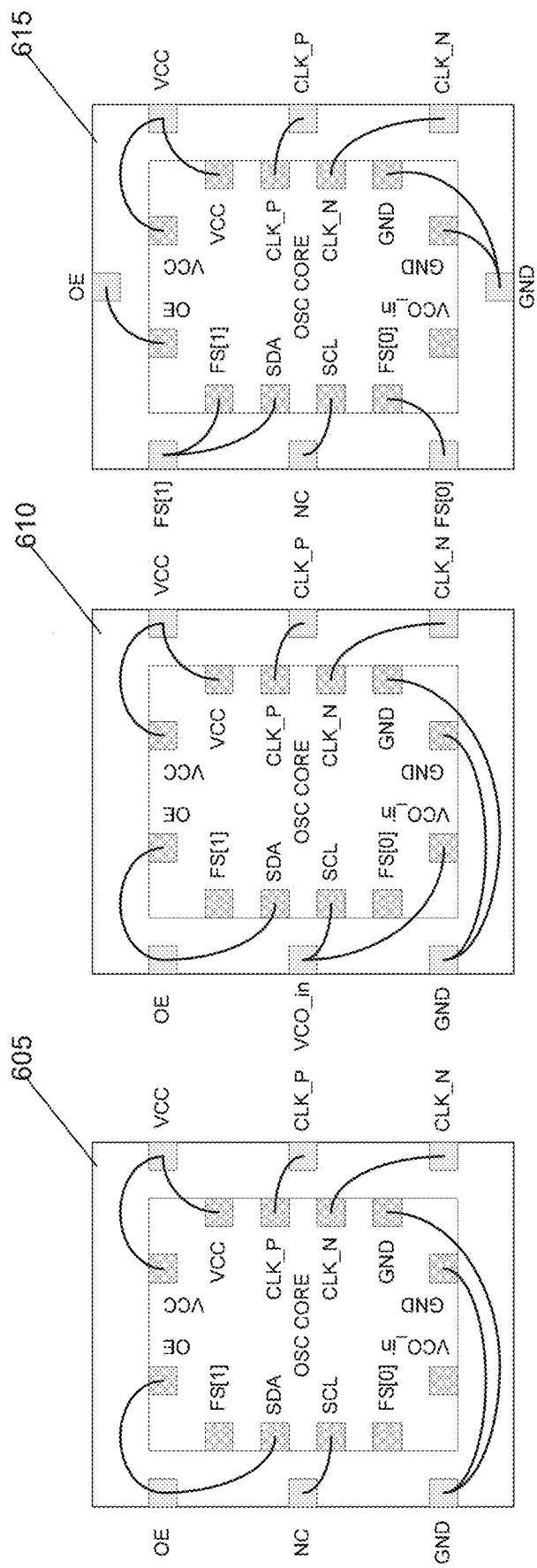
FIG. 6 illustrates various pin configurations for programmable oscillators in accordance with various embodiments of the invention.

The pin packaging configurations for a programmable oscillator may vary as appropriate to the requirements of specific applications. Examples of pin configurations for programmable oscillators in accordance with various embodiments of the invention is illustrated in FIG. 6. In particular, pin configuration 605 illustrates a 6-pin configuration for XO applications, pin configuration 610 illustrates a 6-pin configuration for VCXO applications, and pin configuration 615 illustrates an 8-pin configuration for XO applications.

Figure 7:
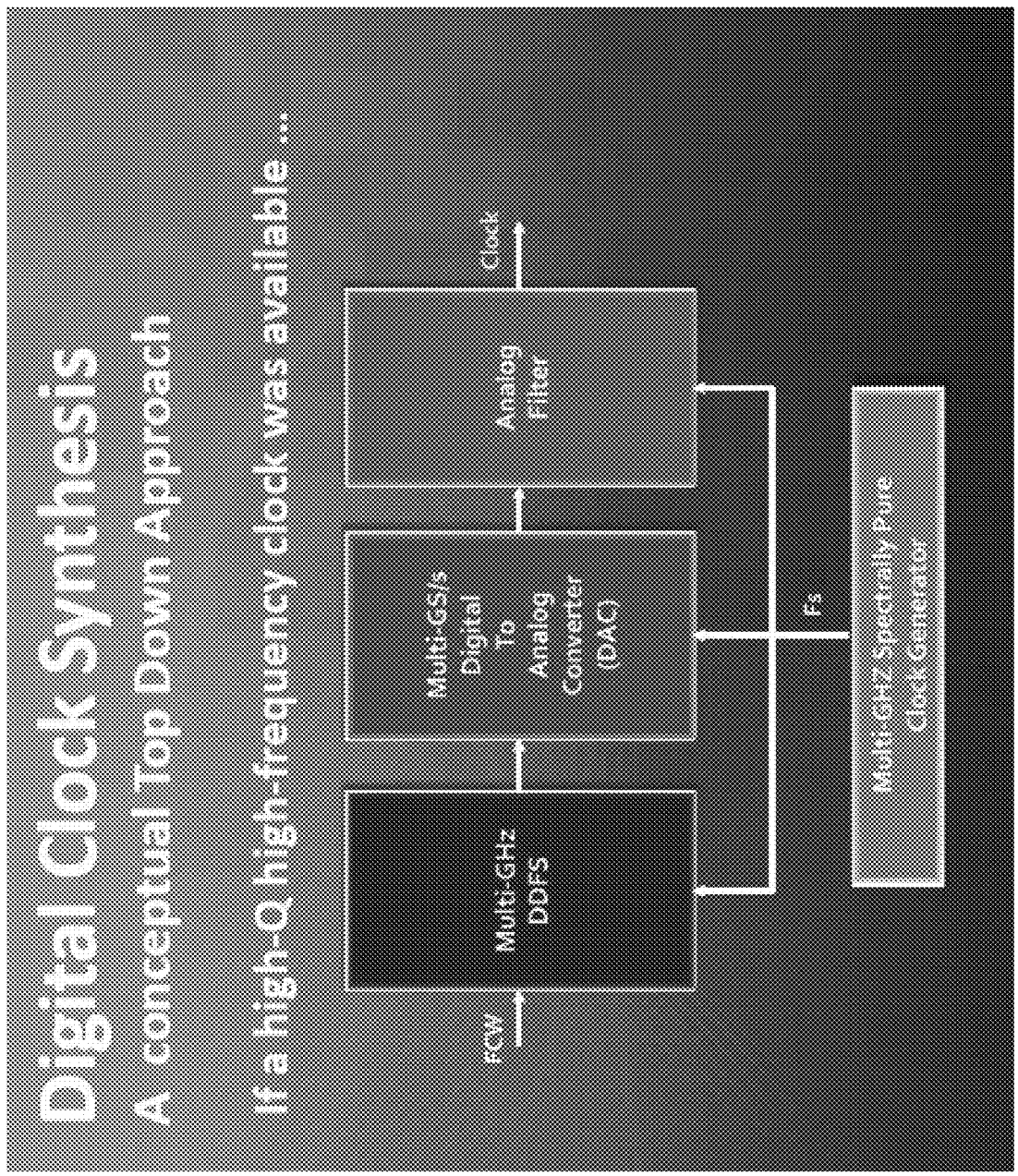
FIG. 7 illustrates components that perform digital clock synthesis in accordance with an embodiment of the invention.

Many embodiments of the invention may use a top down approach for digital clock synthesis that functions in a manner similar to if a high-Q high-Frequency clock had been utilized. An example of digital clock synthesis in accordance with an embodiment of the invention is illustrated in FIG. 7.

Figure 8:
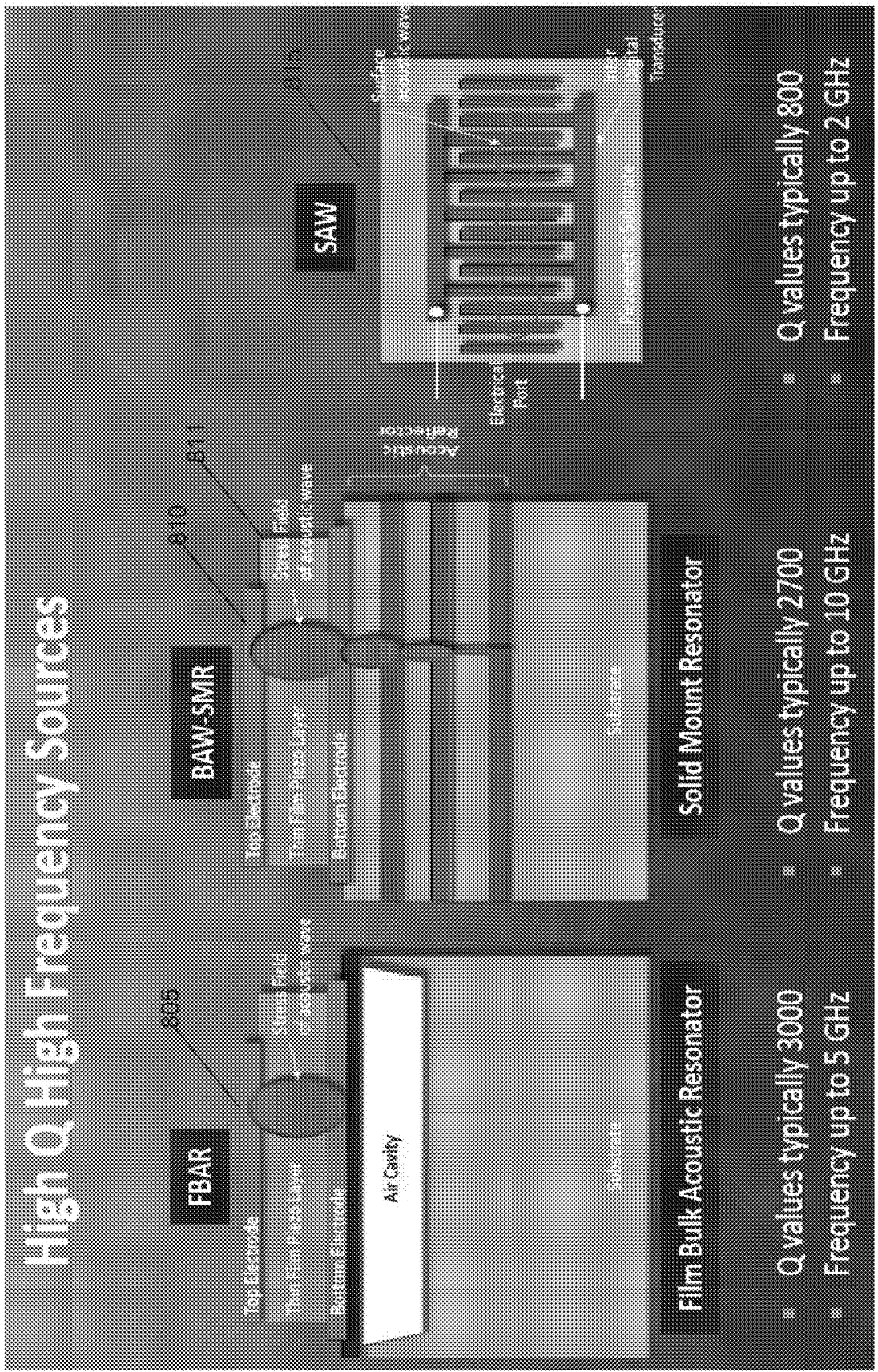
FIG. 8 illustrates a structure of several different types of resonators that may be used within a programmable oscillator in accordance with embodiments of the invention.

Many embodiments of the invention use a resonator to generate a source frequency. The structures of several different types of resonators that may be used within a programmable oscillator provided by a direct frequency synthesizer in accordance with an embodiment of the invention are illustrated in FIG. 8. The resonators may include a film bulk acoustic resonator (FBAR) 805, a solid mount resonator (BAW-SMR) 810, and a surface acoustic wave (SAW) resonator 815. These resonators are shown for example only and any other high frequency resonator can be utilized including (but not limited to) high frequency resonators with frequencies that vary considerably based upon process variations.

As described above, the resonance frequency of a BAW is determined by the thickness of the piezo layer 811 and the neighboring layers. Furthermore, the required tolerance for the resonance frequency is around ±0.1% for typical mobile phone filters, which translates into a thickness tolerance in the same range for the piezolayer 811 and the electrode layers. These extreme thickness tolerances cannot be met by standard tools for semiconductor processes, which typically offer ±5% accuracy. Even if the run-to-run variations can be optimized to meet a tighter specification, there is still a major problem regarding thickness uniformity across the wafer to be solved. Thus, different manufactured BAW resonators will generally have slight differences in their output frequency and this difference may need to be calibrated in order to minimize the effects of noise and increase the accuracy of an output signal being synthesized using the BAW resonator.

The Q values for an FBAR 805 are typically 3000 with frequencies up to 5 GHz. The Q values of BAW-SMR 810 are typically 2700 with frequencies up to 10 GHz. The Q values of SAW 815 are typically 800 with frequencies up to 2 GHz.

Digital Clock Synthesis

Figure 9:
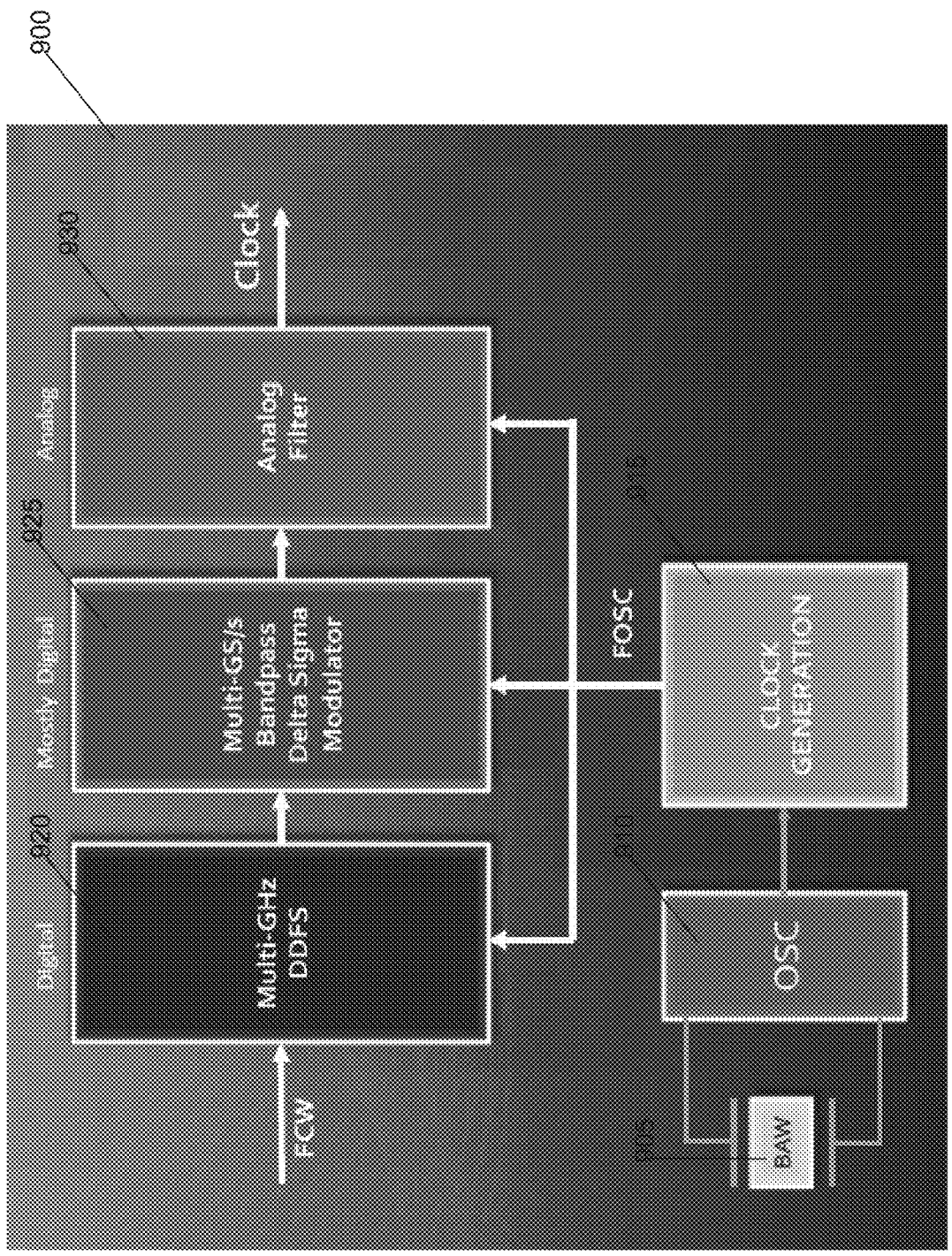
FIG. 9 illustrates a programmable oscillator using a BAW resonator in accordance with an embodiment of the invention.

Many embodiments of the invention provide BAW-based digital clock synthesis. An example of a programmable oscillator provided by a direct frequency synthesizer using a BAW resonator in accordance with an embodiment of the invention that is used for digital clock synthesis is illustrated in FIG. 9. The programmable oscillator circuit 905 includes a BAW resonator 905 that provides a resonant frequency signal to an oscillator (OSC) 910. In accordance with some embodiments, the BAW resonator 905 may be a BAW-SMR resonator as illustrated in FIG. 8, and thus may generate a frequency up to 10 GHz with Q values typically at 2700. In accordance with many embodiments, the BAW resonator 905 may provide low phase noise that directly transfers to the output synthesized clock.

The oscillator 910 provides a signal to a clock generation component 915, which distributes a clock signal to a multi-Ghz DDFS component 920, a multi-Gs/s Bandpass Delta Sigma Modulator component 925, and an analog filter component 930.

The design of a noise shaping filter may be provided by the delta sigma modulator 925 (stability and co-designed with the analog filter). In accordance with many embodiments, the programmable oscillator 900 may provide parallelization of the delta sigma modulator 925 for efficient VLSI implementation, which may have a much wider scope of application beyond clock synthesis. In accordance with some embodiments, examples of other applications include, but are not limited to, direct RF signal synthesis and switching PA.

The programmable oscillator 900 may provide several benefits including, but not limited to, having a wide output clock range with a very fine frequency resolution that is digitally programmable in accordance with some embodiment. Furthermore, there may be continuous phase (no glitch) during frequency changes in accordance with many embodiments of the invention. The programmable oscillator 900 may have a digitally intensive architecture that benefits with CMOS scaling in accordance with a number of embodiments of the invention. Furthermore, programmable oscillator 900 may retain all the benefits of the BAW resonators including superior vibration and shock performance.

In accordance with many embodiments, the use of a resonator may have certain shortcomings that may need to be accounted for, including poor frequency programmability (however, a DDFS can synthesize any frequency up to Fosc/2), poor absolute frequency accuracy, and variation of frequency with temperature.

Frequency Offset Correction

In order to correct frequency offsets, a programmable oscillator may include circuitry for frequency offset correction in accordance with some embodiments. An example of a BAW-based programmable oscillator for digital clock synthesis with frequency offset correction in accordance with an embodiment of the invention is illustrated in FIG. 10.

Figure 10:
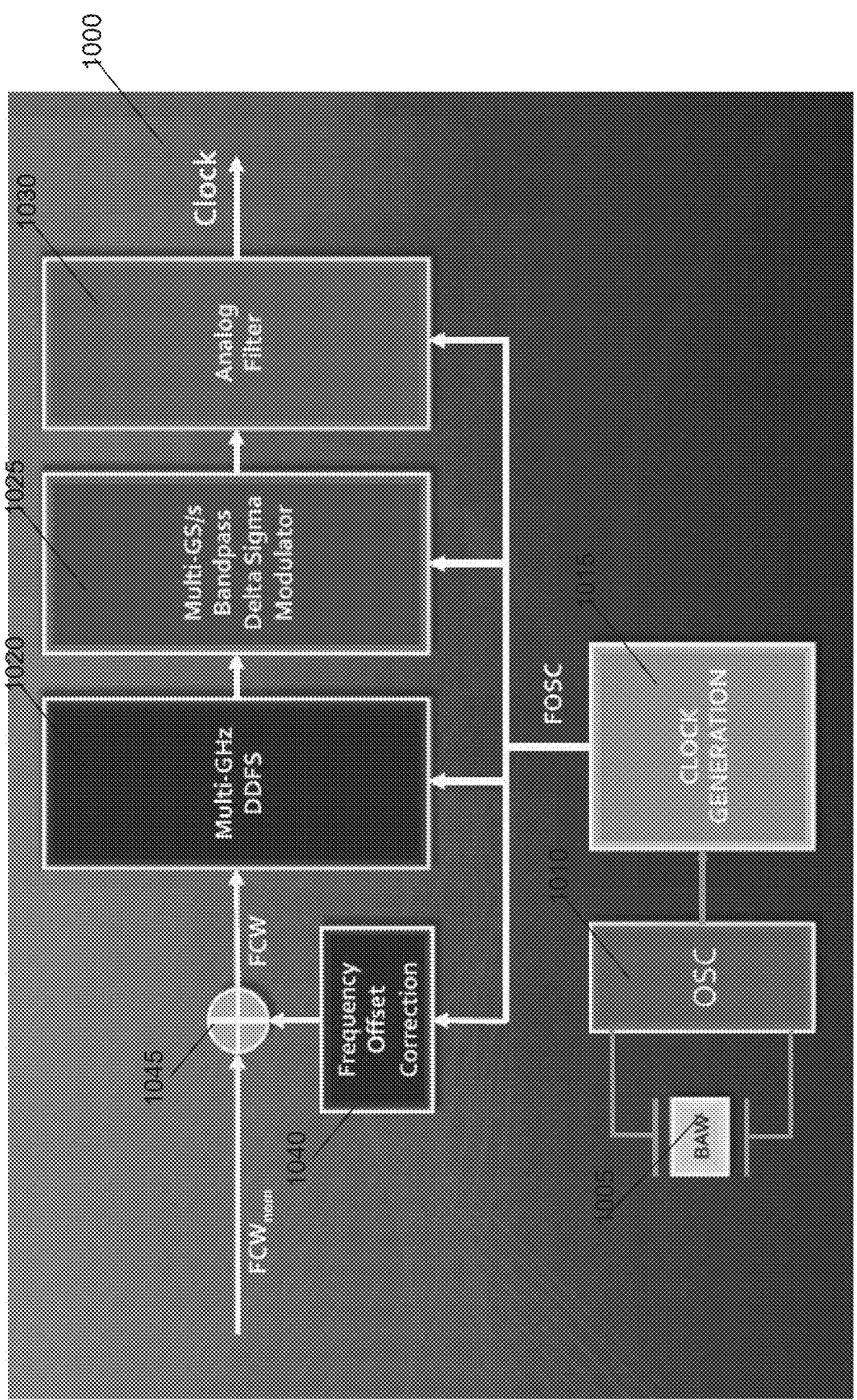
FIG. 10 illustrates a BAW-based programmable oscillator for digital clock synthesis with correcting frequency offsets in accordance with an embodiment of the invention.

The programmable oscillator 1000 illustrated in FIG. 10 includes many of the components described above with reference to FIG. 9, including the BAW resonator 1005, an oscillator 1010, clock generation 1015, multi-GHz DDFS 1020, Delta Sigma Modulator 1025, and Analog Filter 1030. In addition, the programmable oscillator 1000 includes a frequency offset correction circuit 1040 that receives a clock signal from the clock generation circuit 1015 and computes a digital amplitude value for the output signal that corrects for a frequency offset. The frequency offset correction signal is output to an adder circuit 1045 that also receives a frequency control word value. The frequency offset correction signal and the frequency control word are combined and provided to the multi-GHz DDFS 1020 to control the amplitude of the output clock signal in such a way as to generate a clock signal having a desired frequency.

As described above, different BAW resonators may have minor variations in their particular resonant frequencies due to limitations that exist in existing semiconductor manufacturing processes and tools. Thus, programmable oscillators in accordance with many embodiments of the invention are able to detect the particular resonant frequency of a particular BAW resonator and generate a corresponding amplitude value for an output signal that takes into account the particular resonant frequency of that BAW resonator.

Figure 11:
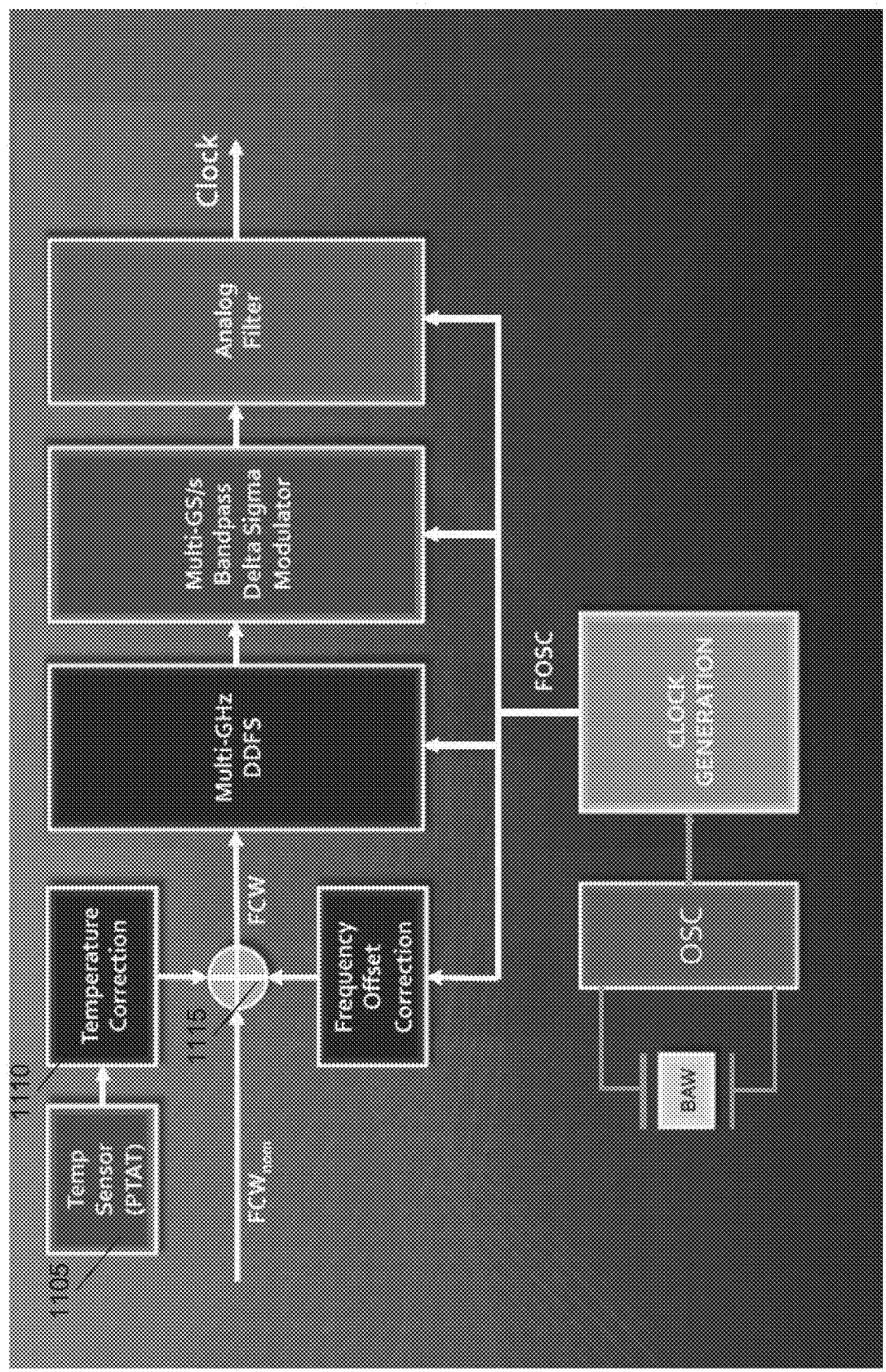
FIG. 11 illustrates a programmable oscillator with BAW-based digital clock synthesis that corrects for frequency variations with temperature in accordance with an embodiment of the invention.
Figure 12:
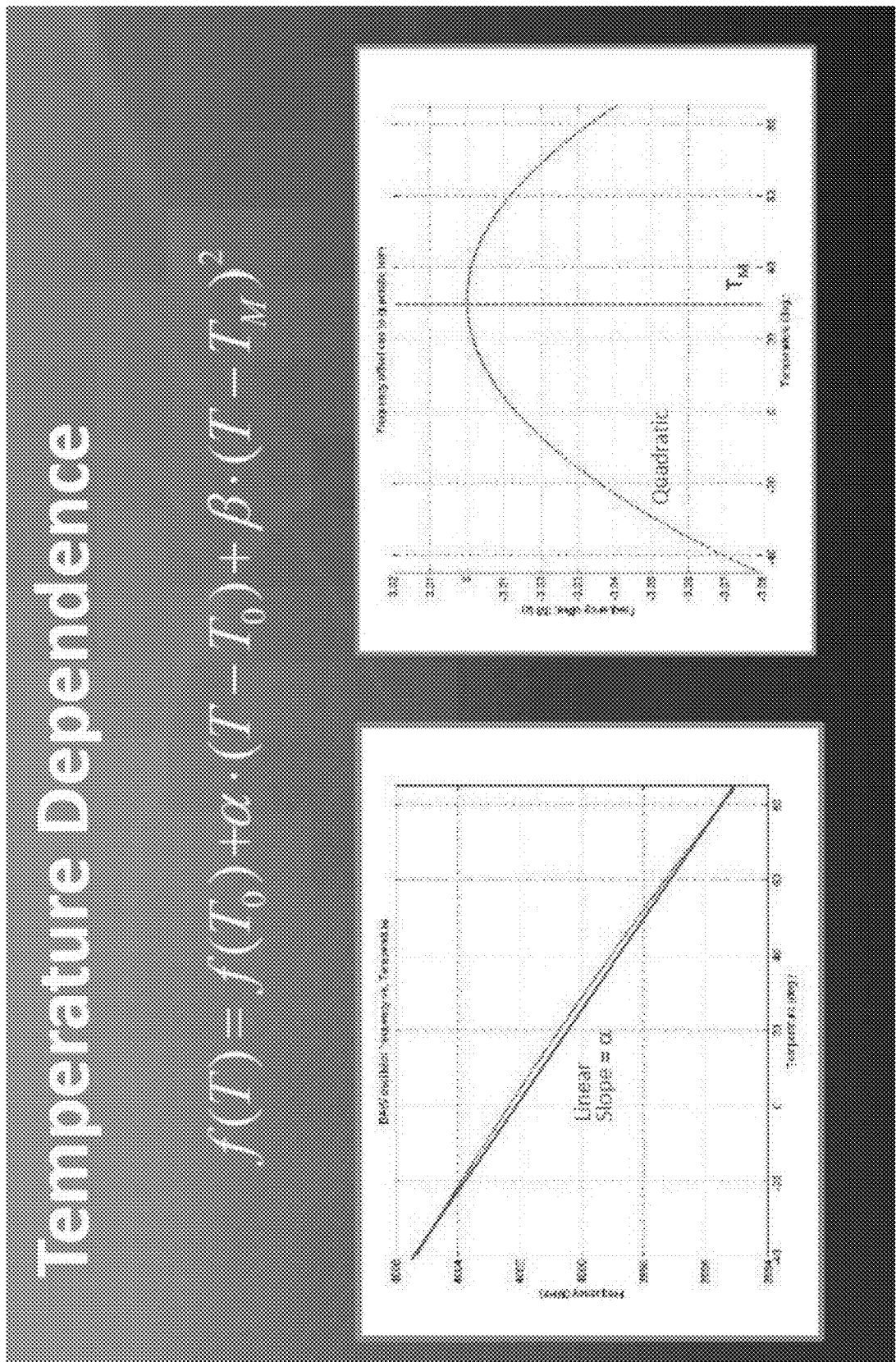
FIG. 12 illustrates an equation used by several embodiments of the invention to compute the temperature dependence of frequency relative to changes in temperature.
Figure 13:
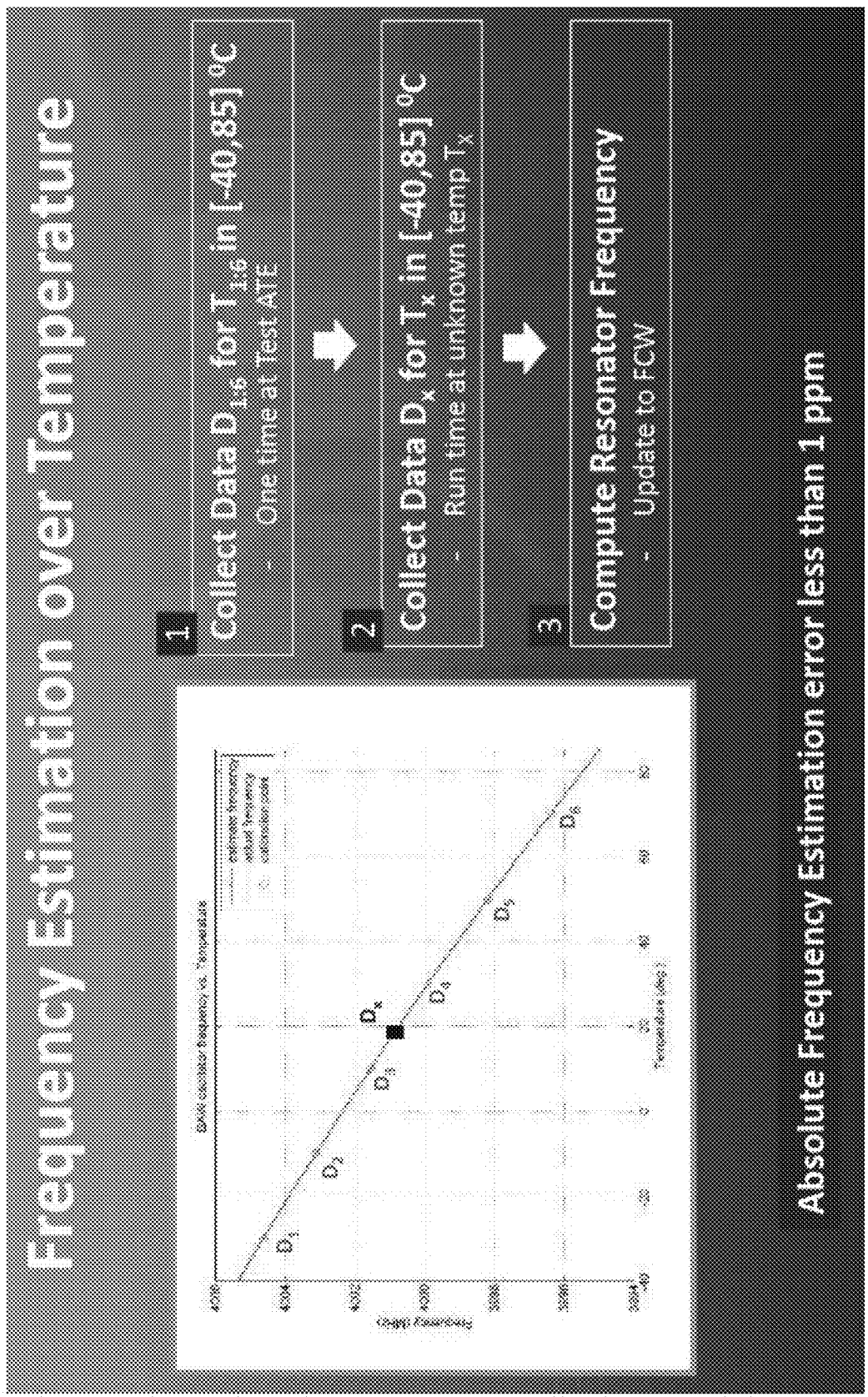
FIG. 13 illustrates a process for frequency estimation over temperature in accordance with an embodiment of the invention.

Furthermore, a programmable oscillator with BAW-based digital clock synthesis may correct for frequency variations with temperature in accordance with many embodiments of the invention. An example of a programmable oscillator with BAW-based digital clock synthesis that corrects for frequency variations with temperature in accordance with an embodiment of the invention is illustrated in FIG. 11. Programmable oscillator 1100 includes the components of a programmable oscillator described above in FIGS. 9 and 10. In addition, programmable oscillator 1100 includes a temperature sensor 1105 and temperature correction circuitry 1110. Temperature sensor 1105 senses temperature and provides a temperature value to a temperature correction circuitry 1110. Temperature correction circuitry uses the temperature value to generate a temperature correction value and outputs the value to the adder 1115. The temperature correction value is added to the control word by adder 1115 to correct for variations in temperature. An equation that illustrates the temperature dependence of frequency relative to changes in temperature and graphs showing the dependence are showing in FIG. 12. A process for performing frequency estimation over temperature and graph showing an example of the results is shown in FIG. 13.

Clock Generator and Jitter Attenuator

Figure 14:
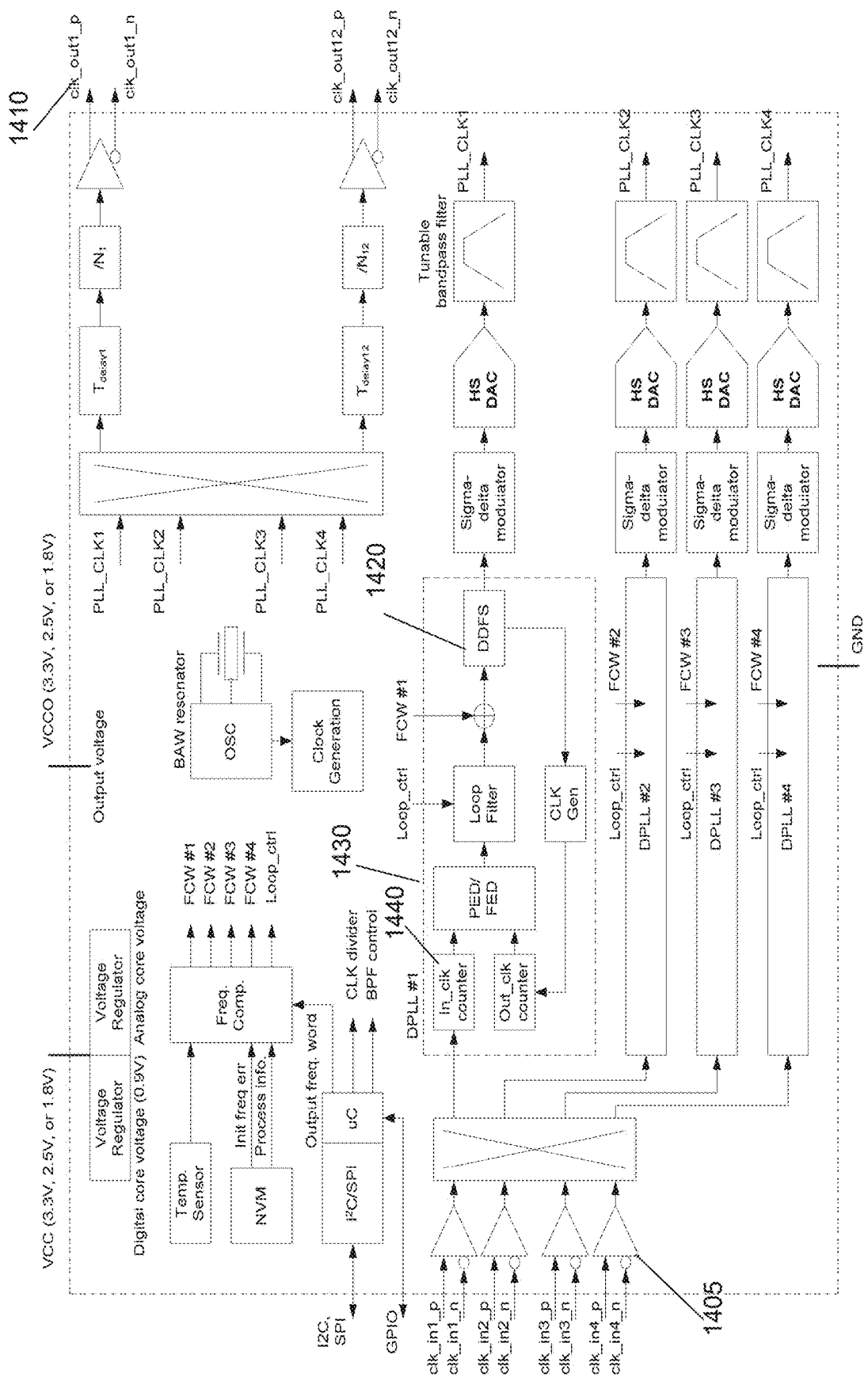
FIG. 14 illustrates a circuit diagram of a clock generator and jitter attenuator where a direct frequency synthesizer is used as part of a PLL for frequency and phase tracking in accordance with an embodiment of the invention.

Many embodiments of the invention synthesize an output frequency based on an input frequency received from a BAW resonator. The synthesis of the output frequency using a direct frequency synthesizer may be used in place of a PLL in accordance with some embodiments of the invention. An example of a circuit diagram of a clock generator and jitter attenuator where a direct frequency synthesizer is used as part of a PLL for frequency and phase tracking in accordance with an embodiment of the invention is illustrated in FIG. 14. In FIG. 14, the chip receives a jittery clock source from multiple sources 1405 and outputs a clean clock 1410 with the same frequency or a frequency that is a multiple of the frequency of the input clock source. The chip also includes a digital PLL 1430 that includes a direct frequency synthesizer in accordance with some embodiments of the invention. In digital PLL 1430, an output clock n is generated using a direct frequency synthesizer (DDFS) 1420. In some embodiments, the frequency and phase tracking may be done with a digital PLL 1430, which consists of a frequency detector, phase detector, and loop filter. In many embodiments, when the PLL 1430 is disabled, the chip becomes a clock generator where the output frequency generated by DDFS 1420 is controlled by the frequency control word (FCW).

Figure 15:
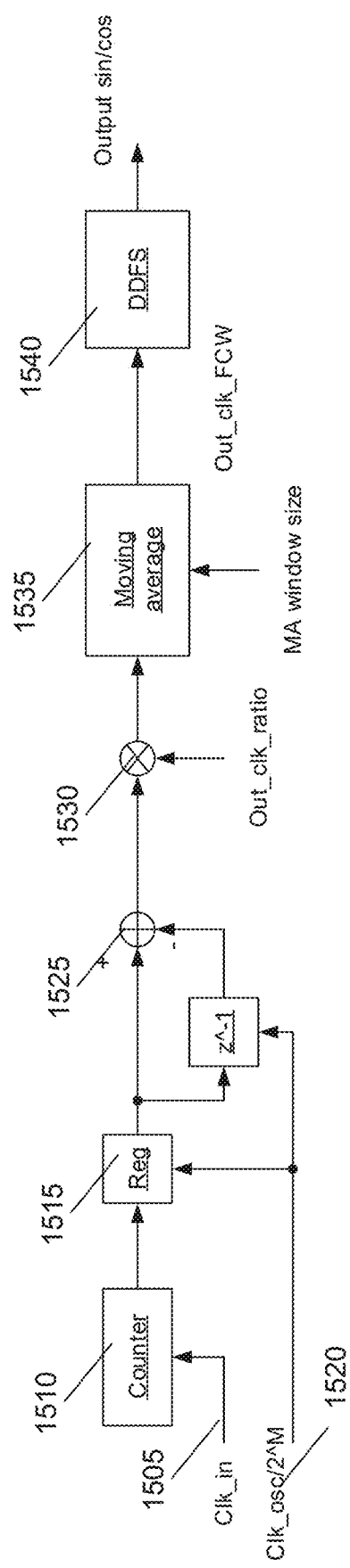
FIG. 15 illustrates a frequency detector or estimator in accordance with an embodiment of the invention.

In some embodiments of a digital PLL that includes a direct frequency synthesizer, input reference frequency estimation may be performed with a counter, where the counter is sampled periodically (e.g., oscillator frequency/2M) and averaged by a moving average (MA) filter. The MA filter may set the bandwidth of the frequency tracking loop. The output frequency may be equal to the input frequency multiplied by a programmable factor. A circuit diagram of a frequency detector or estimator for a digital PLL that includes a direct frequency synthesizer in accordance with an embodiment of the invention is illustrated in FIG. 15. In FIG. 15, an input clock 1505 clocks a counter 1510. The counter 1510 is sampled (1515) periodically by a local oscillator 1520 or an integer divided down clock. In accordance with certain embodiments, the output of the counter block 1510 is the estimate of the input and local clock frequency ratio. The ratio estimate may be averaged by a moving average circuit 1535 for better estimate accuracy in accordance with some embodiments. In the illustrated embodiment, the difference (1525) between the current previous samples of the counter is multiplied (1530) by a reference output clock ratio signal and provided to the moving average circuit 1535. The averaged ratio estimate may be sent to the DDFS 1540 for output frequency synthesis. In many embodiments, since this is a frequency detector, the frequency acquisition of the loop is deterministic. Furthermore, the frequency acquisition is reliable and the frequency acquisition time may be determined by the moving average window size in accordance with a number of embodiments. This is contrary to traditional PLL that may use only a phase detector. Although FIG. 15 illustrates an example of a frequency detector or estimator for a PLL including a direct frequency synthesizer in accordance with an embodiment of the invention, any of a variety of different architectures may be utilized as appropriate to the requirements of specific applications in accordance with various embodiments of the invention.

Figure 16:
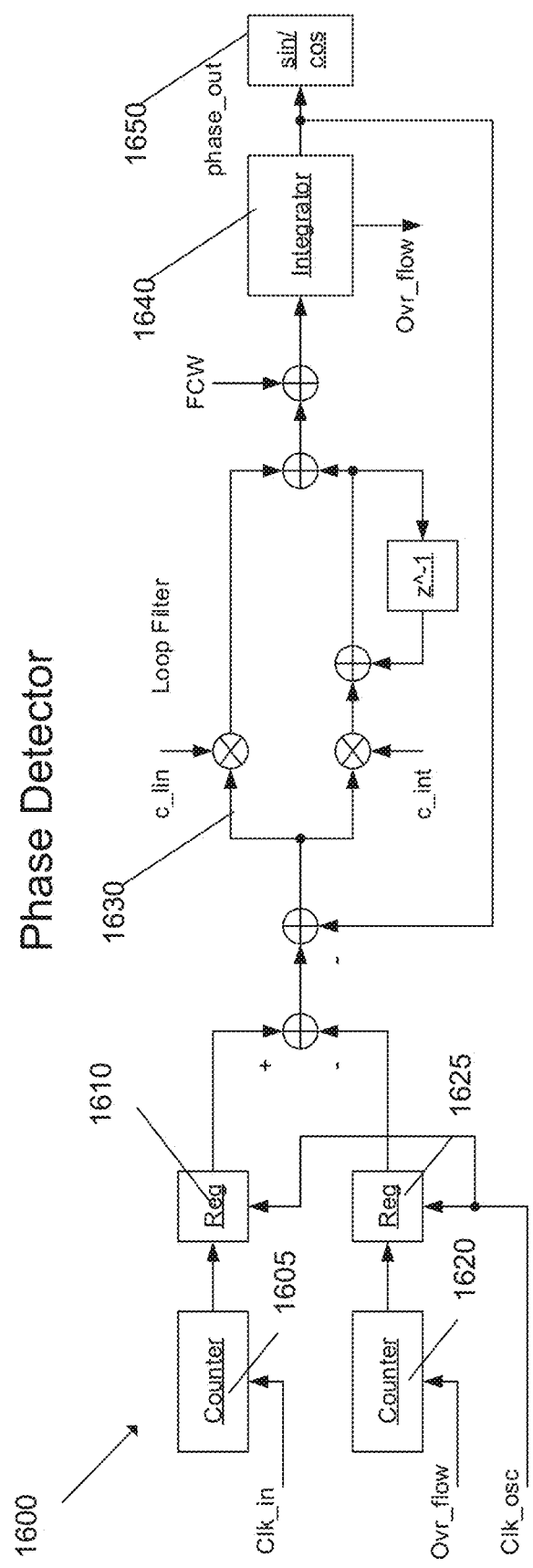
FIG. 16 illustrates a phase detector in accordance with an embodiment of the invention.

A circuit diagram of a phase detector for a PLL including a direct frequency synthesizer in accordance with an embodiment of the invention is shown in FIG. 16. The phase detector 1600 may be used when the phase tracking of an input signal is needed. The phase tracking may be done with a $2^{nd}$ order PLL and the phase error may be the difference between phase accumulator phase and input clock counter, where each count in the input clock counter may correspond to $2\pi$. Furthermore, a frequency control word (FCW) may be derived from the frequency estimation in accordance with some embodiments of the invention.

Phase detector 1600 includes two counters 1605 and 1620. A first counter 1605 is clocked by the input clock and a second counter 1620 is clocked by the output clock (ovr_flow signal corresponds an output clock edge). Both counters 1605 and 1620 may be sampled (1610, 1625) by the local oscillator periodically. A higher count value in the input counter may correspond to a late condition (the output clock falls below the input clock). A lower count value in the input counters may correspond to an early condition. An early/late error signal may be provided to a 2nd order digital loop filter 1630. The loop filter output may be used to drive a DDFS (1640, 1650) in accordance with some embodiments of the invention.

Using both frequency and phase error detection, a PLL can achieve very fast and robust frequency acquisition and tracking. In accordance with several embodiments, at the initial startup, the frequency detector is ON and the frequency acquisition is completed in a time set by a moving average window size. In accordance with certain embodiments, after the initial frequency acquisition, the phase detector is ON and the loop is in phase tracking mode. The frequency detector can be switched OFF or set to a very narrow bandwidth in accordance with various embodiments.

A PLL with a direct frequency synthesizer architecture offers several advantages over traditional designs, including: (1) the best possible phase noise performance and the phase noise performance is limited by the resonator Q, (2) using both frequency and phase detector for robust frequency acquisition and phase tracking (3) all frequency and phase tracking circuitry are implemented in the digital realm, (4) size scaling, (5) small loop bandwidth is possible without the big size capacitor off chip, (6) there is no loop cross talk so the number of PLLs integrated in a chip may be unlimited, and (7) a very wide frequency acquisition range is possible since it may be implemented as a DDFS. In summary, a dual loop structure may be used for phase and frequency tracking in clock generator and jitter attenuator products. In particular, at the startup, the frequency loop may be ON with wide bandwidth to acquire the frequency. After the acquisition, the frequency loop may be switched to narrow bandwidth and the phase loop may be ON for tracking. Although FIG. 16 illustrates an example of a phase detector for a PLL including a direct frequency synthesizer in accordance with an embodiment of the invention, any of a variety of different architectures may be utilized as appropriate to the requirements of specific applications in accordance with embodiments of the invention.

Crystal Resonator in a PLL

Figure 20:
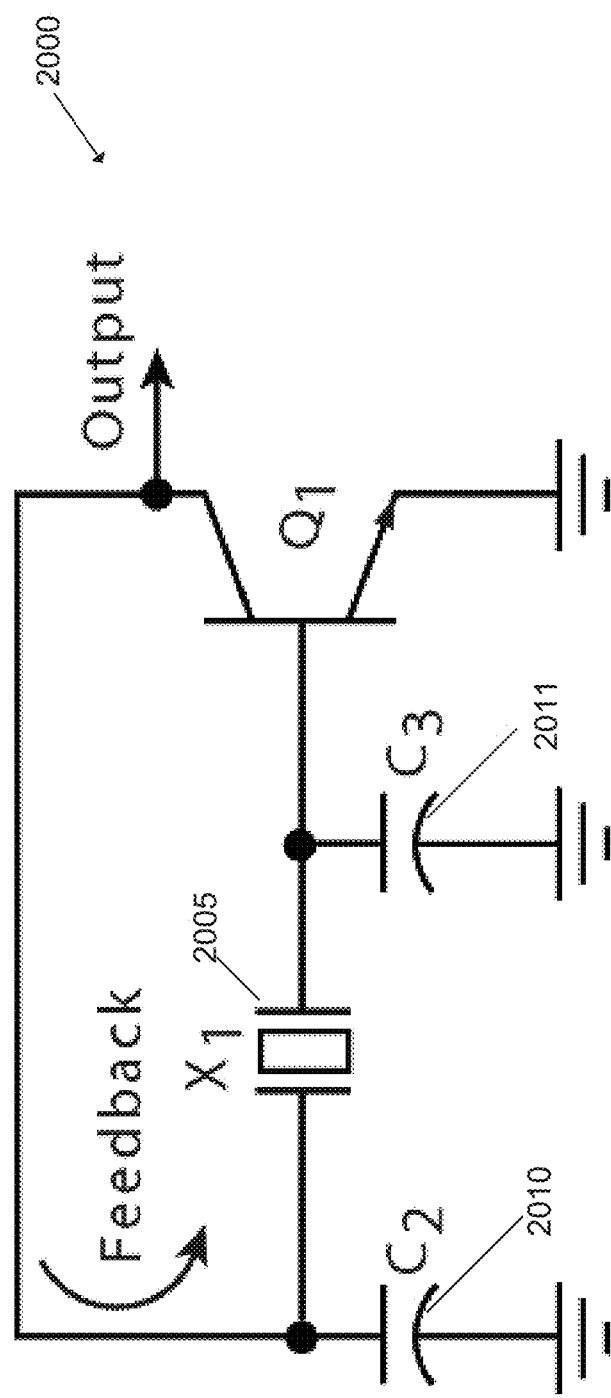
FIG. 20 illustrates an embodiment of a crystal oscillator.

While quartz crystal has served the oscillator market well over the years, it nevertheless has several shortcomings. First, the oscillation frequency of quartz crystal is fixed by the crystal thickness. Commercially available crystals have a thickness around 25 um, which is equivalent to a fundamental frequency of 60 MHz. In order to operate at higher frequencies, a crystal has to be thinned. One limitation to the thinning is the need to mechanically support the thin-plate resonator afterwards. An example of a crystal oscillator is shown in FIG. 20. Crystal oscillator 2000 shown in FIG. 20 is an example of a Pierce oscillator. In a Pierce oscillator the combination of a crystal 2005 with two capacitors 2010-2011 form a pi network band pass filter that provides a 180 degree shift and voltage gain from the output to the input at the resonant frequency of the crystal. Thus, the crystal can be considered a high Q inductor making crystal oscillators useful for most consumer electronic applications.

However, higher speed communications in the networking and storage markets demand higher frequency oscillators of up to 160 MHz and higher to support communication processes. To achieve a flexible output frequency, oscillator designers apply a phase-locked loop (PLL) technique to the crystal oscillator design that is known as a PLL XO architecture. The PLL is a control system that generates an output signal whose phase is related to the phase of an input signal.

Figure 21:
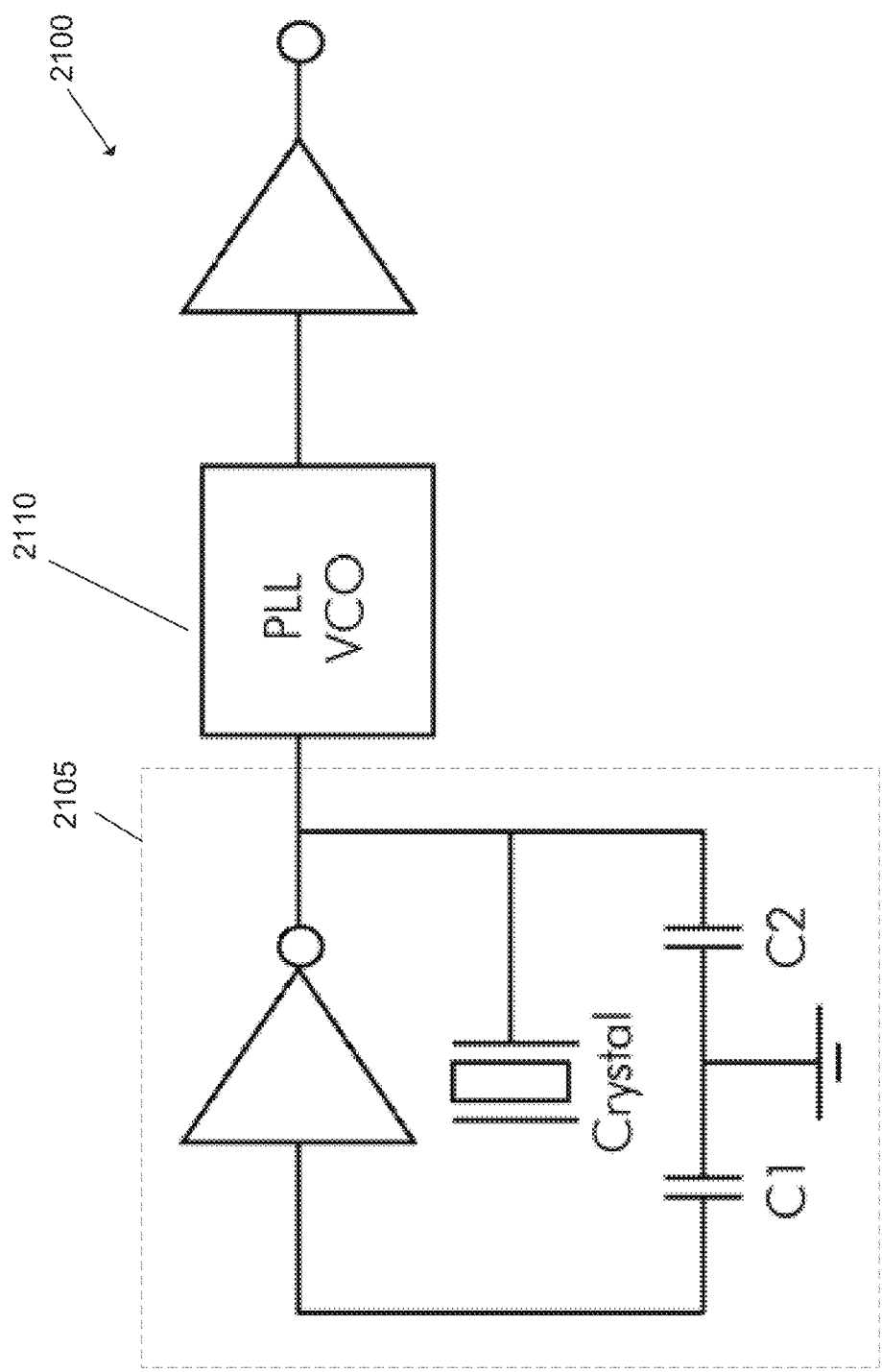
FIG. 21 illustrates an embodiment of a PLL crystal oscillator (XO) architecture.

An embodiment of a PLL XO architecture is illustrated in FIG. 21. PLL XO architecture 2100 includes a crystal oscillator 2105. A PLL 2110 follows the fundamental crystal oscillator 2105. PLL XO architecture 2100 delivers crystal stability and reasonable phase noise to meet application requirements of high speed networking and storage serial connectivity. Many embodiments of PLL XO architectures may use a fractional PLL, whereby the output frequency can be at any arbitrary ratio of the input frequency. In these embodiments, the oscillator phase noise performance may depend heavily on the PLL's performance.

Figure 22:
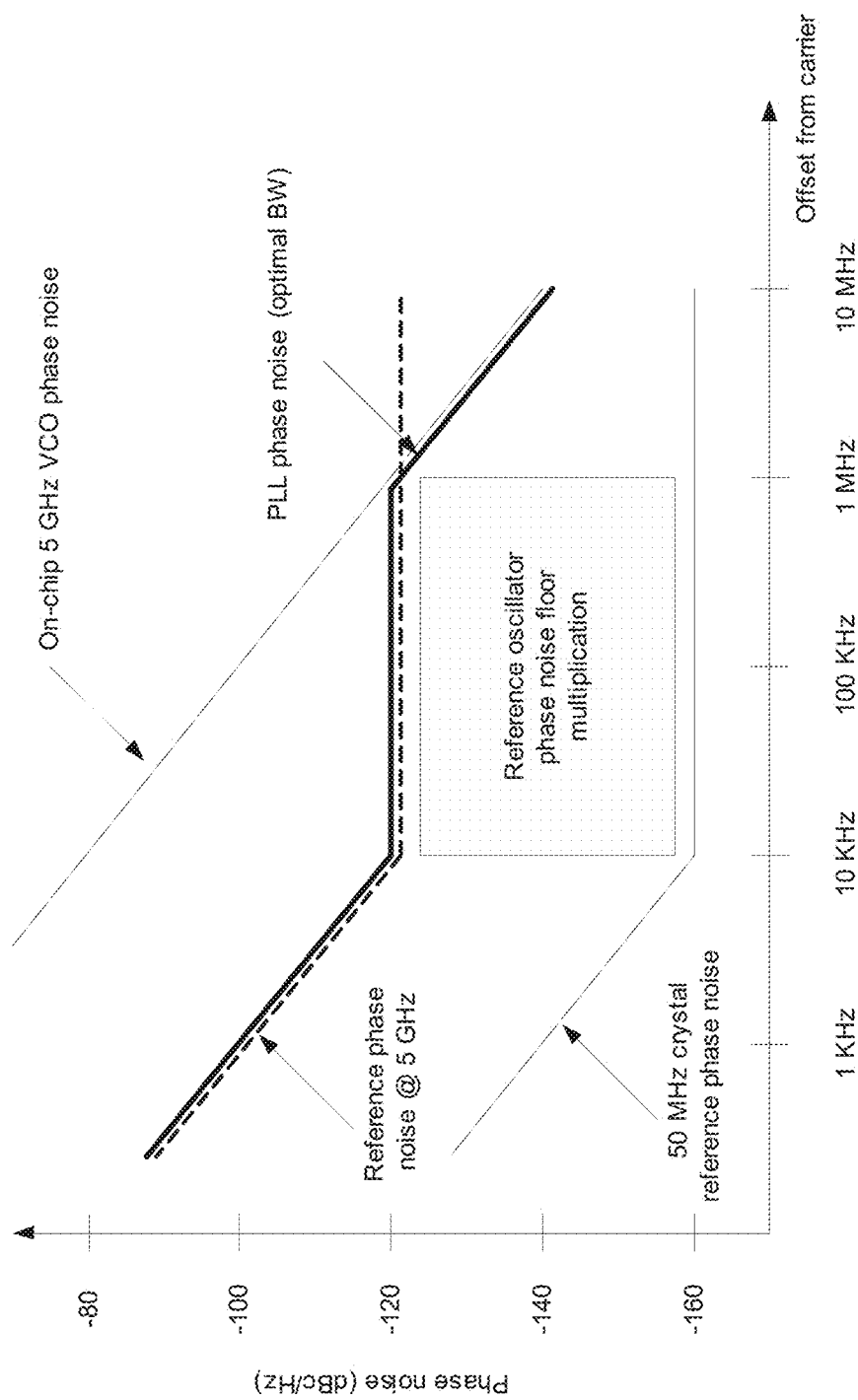
FIG. 22 illustrates a PLL XO output phase noise plot for a traditionally designed PLL.

An example of a PLL XO output phase noise plot for a traditionally designed PLL is illustrated in FIG. 22. As shown in the FIG. 22, the lower frequency phase noise tracks the crystal phase noise and the higher frequency phase noise tracks the on-chip VCO phase noise. There is an intermediate frequency region where the phase noise is mostly flat and the phase noise amplitude in this region is determined by the PLL loop bandwidth. The PLL output phase noise is the sum of the low pass filtered crystal oscillator phase noise and the high pass filtered on-chip VCO phase noise. The PLL loop bandwidth should be optimized to minimize the output sum. The on-chip VCO has a much smaller Q than the crystal resonator Q. Thus, the on-chip VCO has a much higher phase noise than the crystal oscillator at the lower frequency. As such, the PLL loop bandwidth should be set to high to track the crystal oscillator in the lower frequency range. Furthermore, the crystal oscillator phase noise in the high frequency region is limited by the thermal noise floor and input-output frequency ratio. As output frequency increases, the phase noise floor of the crystal oscillator also increases. Thus, the PLL loop bandwidth cannot be set arbitrarily high for phase noise minimization. In addition, the PLL loop bandwidth may be limited by the reference frequency and it is typically less than 10% of the reference frequency for stability consideration. See e.g., F. M. Garnder, Phaselock Techniques, 2nd ed. New York: McGraw-Hill, 1993. The optimal PLL loop bandwidth may be around the frequency region where the on-chip VCO phase noise falls below the crystal oscillator phase noise floor.

As shown in FIG. 22, a significant amount of the PLL phase noise may be due to the frequency multiplication of the reference crystal oscillator. The phase noise degradation gets worse as the ratio of input-output frequency increases. Given the physical size limitation of the crystal cut, the resonant frequency of the crystal resonator may be limited to be less than 60 MHz. Thus, the input-output frequency ratio increases as the output frequency is increased. With the growing demand of communication bandwidth, wireless communication is moving into millimeter and microwave bands while the fiber optics communication is moving toward 100 Gb/s and beyond. All these communication systems demand higher performance reference clocks. Accordingly, traditional clock generation based on MHz crystals has been the bottleneck of the overall system performance.

To meet these performance demands, various new types of resonators have been introduced included, but not limited to, a bulk acoustic wave (BAW) resonator, a film bulk acoustic resonator (FBAR), a spectral multiband resonator (SMR), and a contour mode resonator (CMR).

All the above described resonators are capable of resonating at multiple-GHz with high Q. However, due to the thermal expansion of the AlN layer, the resonant frequency of these resonators may vary over temperature. The uncompensated resonator has a first-order temperature coefficient of frequency (TCF) of −20 to −30 ppm/° C. Compensation layer with positive TCF such $SiO_2$ has been added to compensate the frequency drift over temperature. The compensated resonator has a first-order TCF of 1 to 2 ppm/° C. The overall frequency variation over the commercial temperature range can be well over 200 ppm even for a temperature compensated resonator. Furthermore, the initial frequency offset due to fabrication variation can be as high as 1000 ppm. The large frequency variation of these resonators make them not suitable for use as a reference oscillator despite the high frequency and high Q factor characteristics.

Figure 23:
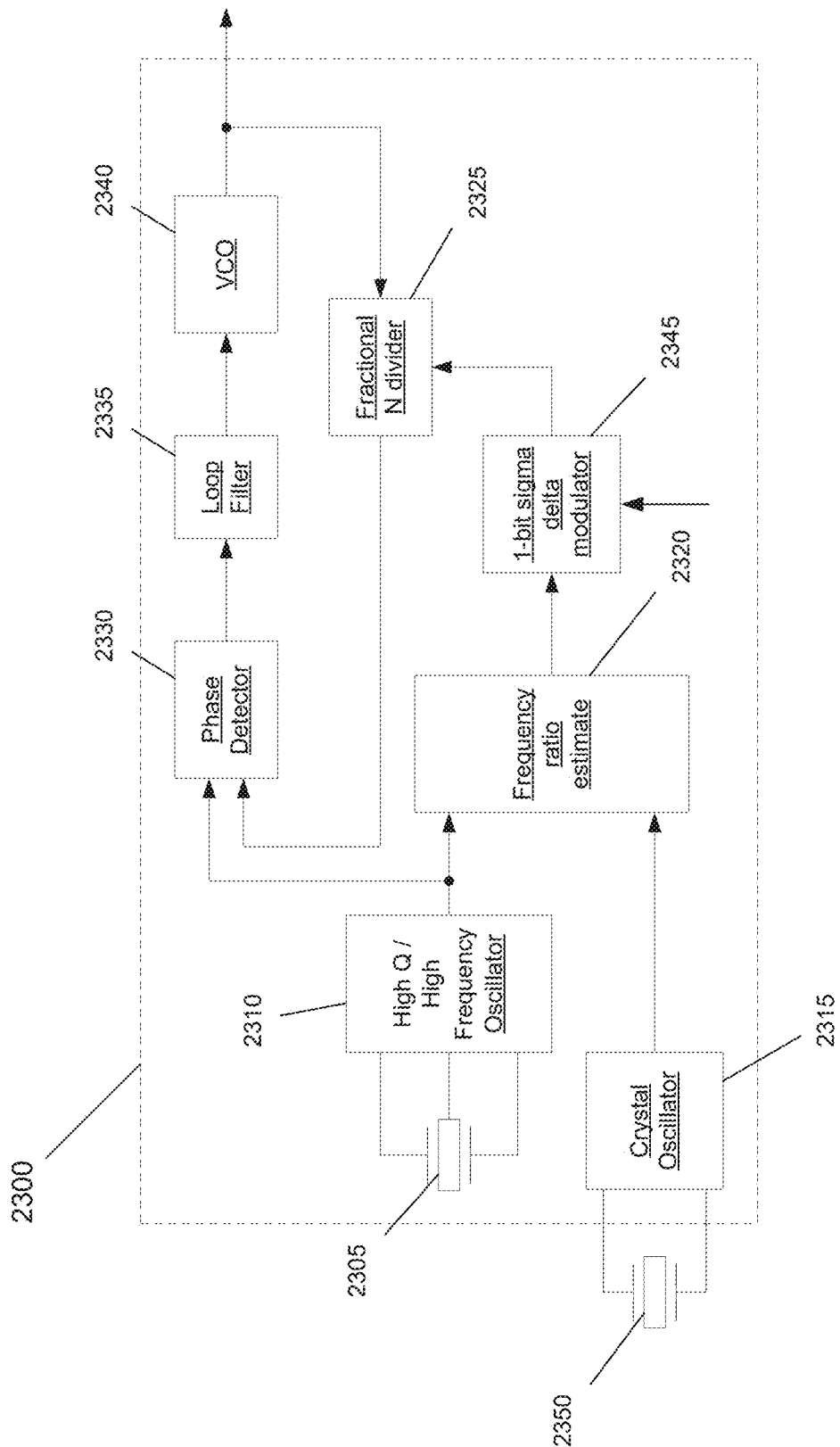
FIG. 23 illustrates a PLL architecture having a high Q/high frequency resonator in accordance with an embodiment of the invention.

Accordingly, PLLs in accordance with some embodiments of the invention use a high Q/high frequency resonator as part of a PLL architecture to improve PLL phase noise performance. A PLL architecture having a high Q/high frequency resonator in accordance with an embodiment of the invention is illustrated in FIG. 23. The PLL architecture 2300 includes a high Q/high frequency resonator 2305, an oscillator 2310, a crystal 2350, a crystal oscillator 2315, a frequency ratio estimation block 2320, and a fractional-N PLL. The fraction-N PLL includes a fractional n divider 2325, a phase detector 2330, loop filter 2335, and voltage controlled oscillator ("VCO") 2340. The PLL architecture 2300 uses the high Q/high frequency resonator 2305 to generate the reference clock source. In accordance with some embodiments, the high Q/high frequency resonator 2305 can be a FBAR, SMR-BAW, CMR, or any other MEMS resonator. The resonant frequency of a high Q/high frequency resonator 2305 can vary over temperature and fabrication process.

The PLL architecture illustrated in FIG. 23 also uses a crystal 2350 to generate a stable clock source. In many embodiments, the crystal 2350 can generate a low frequency. In accordance with many embodiments, the crystal oscillator 2315 is a stable clock source that may be used to measure the initial frequency and frequency change of the high frequency reference clock source from high Q/high frequency oscillator 2305. The frequency ratio between the high frequency reference and the stable reference is denoted as N2. To generate a stable output frequency N times of the stable clock source, N1=N/N2 is used to control the fractional divider 2325 in the fractional-N PLL in accordance with some embodiments of the invention. Given N2 is tracking the frequency change of the reference oscillator, N1 is changing accordingly so the ratio between the PLL output and the stable clock source stays constant. Although FIG. 23 illustrates using a high Q/high frequency resonator with certain PLL components, any of a variety of components may be utilized to reduce phase noise as appropriate to the requirements of specific applications in accordance with various embodiments of the invention.

Figure 24:
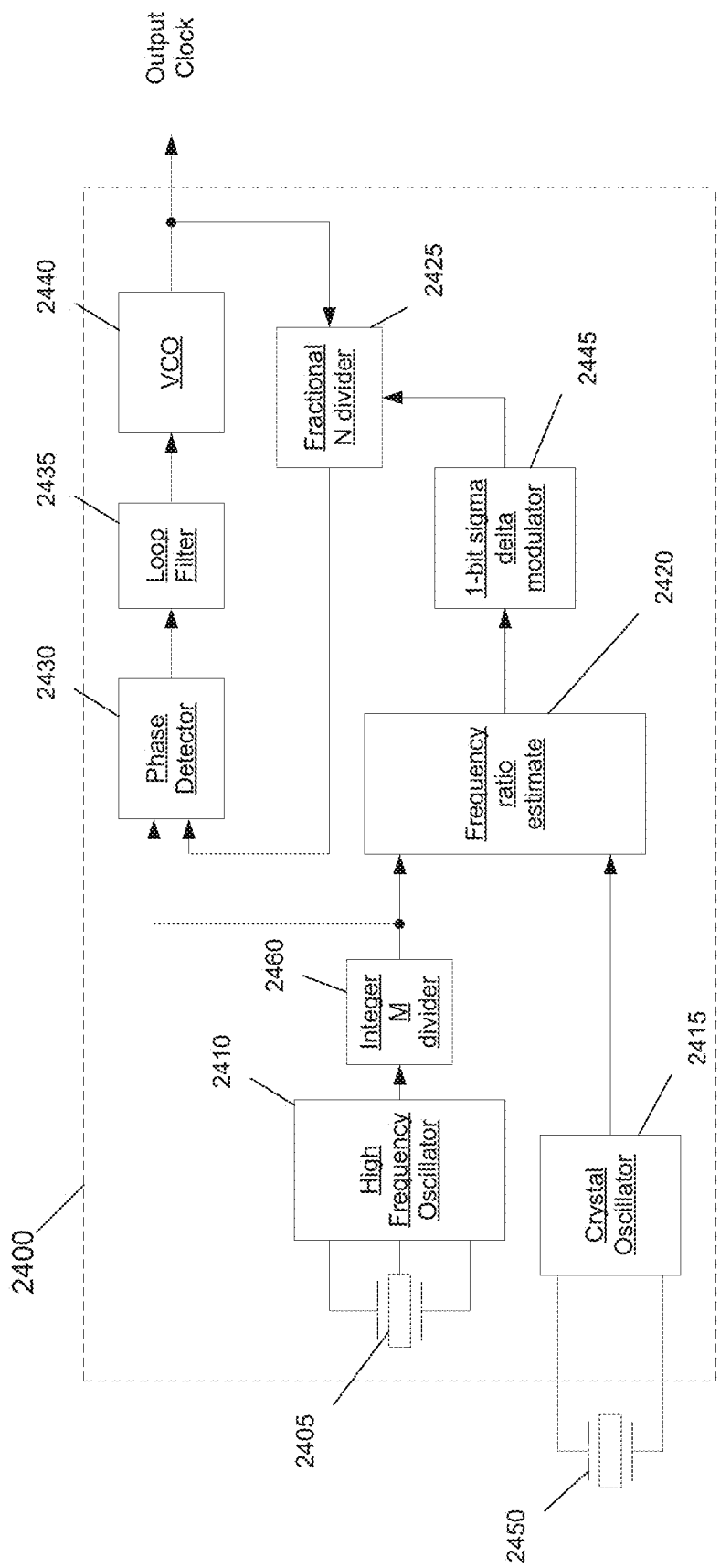
FIG. 24 illustrates A PLL architecture that uses a high Q/high frequency resonator and an integer divider in accordance with an embodiment of the invention.

Many embodiments may use an integer divider as part of a PLL architecture in order to limit a reference frequency that in turn reduces power consumption. A PLL architecture that uses a high Q/high frequency resonator and an integer divider in accordance with an embodiment of the invention is shown in FIG. 24. In PLL architecture 2400, the high frequency reference generated by the high frequency oscillator 2410 is divided down by an integer divider 2460 to limit the reference frequency. A lower reference frequency can reduce the power of the fractional-N PLL that includes fractional N divider 2425, phase detector 2430, loop filter 2435, and VCO 2440, at the expense of the phase noise performance degradation. The programmable reference divider (integer M divider 2460) enables phase noise performance and power trade off in real time. Although FIG. 24 illustrates using an integer divider to limit a reference frequency, any of a variety of mechanisms may be utilized to limit the reference frequency as appropriate to the requirements of specific applications in accordance with many embodiments of the invention.

Figure 25:
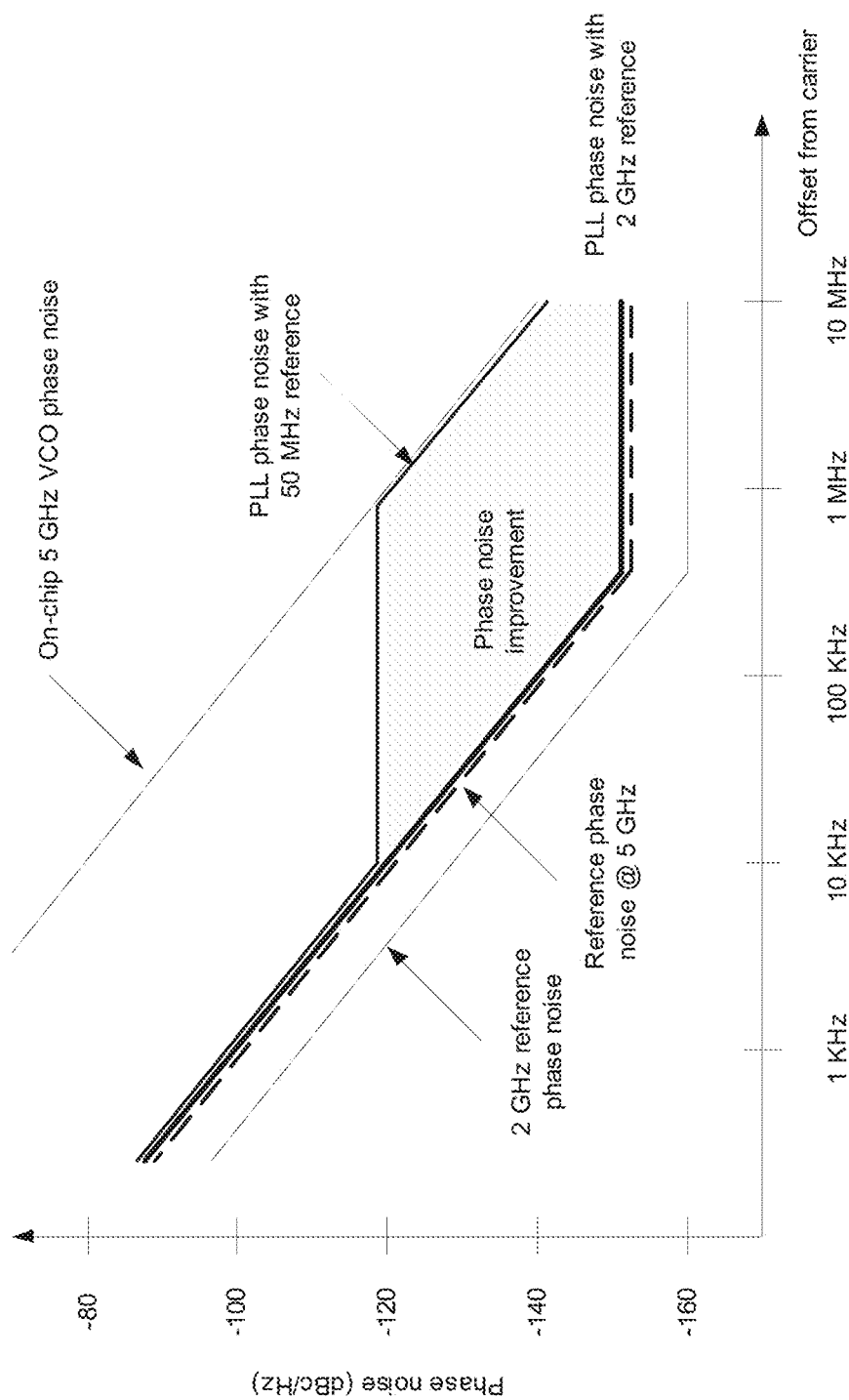
FIG. 25 illustrates a plot of output phase noise for an example of a PLL that uses a high Q/high frequency resonator in accordance with many embodiments of the invention.

In the PLL architecture 2400 illustrated in FIG. 24, the output phase noise may consist of 3 regions: 1) low frequency region tracking stable crystal phase noise; 2) intermediate frequency region tracking high Q/high frequency resonator phase noise; and; 3) high frequency region tracking on-chip VCO phase noise. A plot of output phase noise for an example of a PLL that uses a high Q/high frequency resonator in accordance with many embodiments of the invention is shown in FIG. 25. In accordance with many embodiments, the crystal is also high Q. Thus, there is no visible transition in phase noise between a lower frequency region and an intermediate frequency region. Furthermore, the temperature variation of the high Q resonator may be very slow (in seconds) and the frequency estimation loop bandwidth may be narrow. As seen in FIG. 25, there may be significant improvement in phase noise performance over a PLL with a lower frequency reference (50 MHz). With a high frequency reference, the bandwidth of the fractional-N PLL can be made significantly higher. Wider bandwidth may push out the on-chip VCO phase noise contribution and reduce the overall output phase noise.

The above described PLL architectures provide several advantages over the prior art PLL architectures. In particular, many embodiments of a PLL architecture with a high Q/high frequency resonator in accordance with some embodiments of the invention significantly improve phase noise over the traditional crystal oscillator architecture, especially in the close-in frequency (in-band phase noise). In many embodiments, the phase noise improvement in dB is 20*log 10 of the ratio of the high Q resonator frequency and the reference frequency. Furthermore, the PLL architectures of many embodiments can be highly integrated when combined with a MEMS resonator such as film bulk acoustic resonator (FBAR), solidly mounted bulk acoustic resonator (SMR-BAW), and contour mode resonator (CMR). Likewise, high Q MEMS resonators may not have a stable frequency property (over temperature and fabrication) as compared to crystal resonators. Thus, PLL architectures in accordance with some embodiments of this invention make use of frequency estimation and compensation schemes such that the high Q MEMS resonators can be used as frequency reference in the clock generation. Furthermore, clock generation and translator design with integrated high Q/high frequency MEMS resonator(s) may provide two advantages over current design including, but not limited to, (1) higher phase noise performance with higher frequency reference and (2) higher integration with chip-scale MEMS resonator.

Direct RF Transmitter

Modern high-speed DACs that feature high resolution and multi-GHz sample rates provide a basis for some direct RF modulation schemes. In the RF modulation schemes, the modulated transmission signal is generated directly on the base frequency. The direct RF transmitter architecture offers many advantages over the traditional RF transmitter such as elimination of a LO feed through and an image. In accordance with these schemes, the performance of direct RF transmitter is limited by the DAC noise and the phase noise of DAC clock. The phase noise of the DAC clock determines the adjacent channel leakage ratio (ACPR) and transmitter modulation error ratio (MER) at the high carrier frequency. As discussed earlier, the phase noise performance of indirect frequency synthesis using a PLL is inferior to the BAW oscillator. A direct RF transmitter with a BAW based oscillator has the better phase noise performance.

Figure 17:
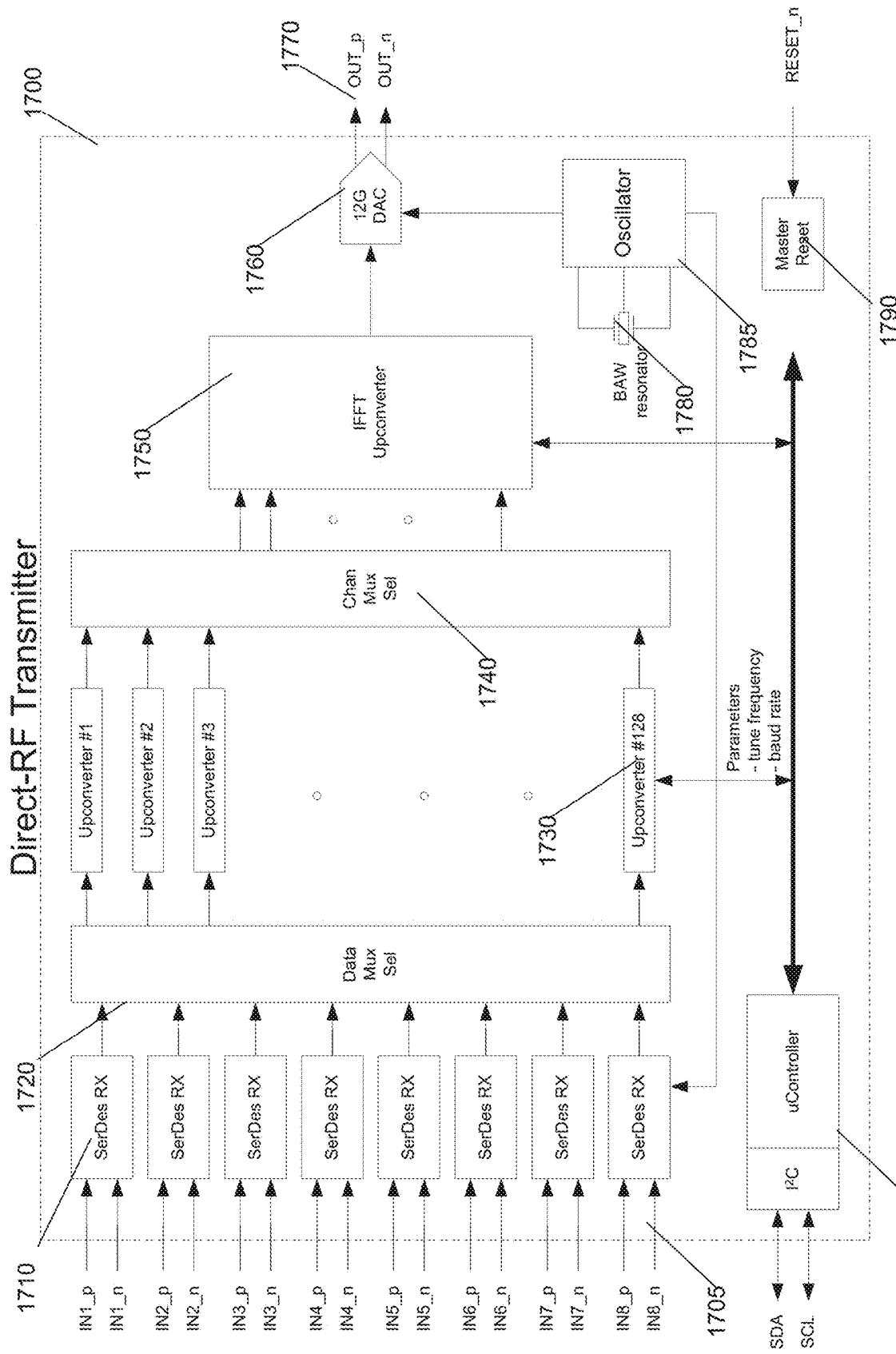
FIG. 17 illustrates a direct RF-transmitter in accordance with an embodiment of the invention.

The above discussion relates to synthesis of a single frequency or a pure tone. However, similar circuits can be utilized to directly synthesize a modulated RF signal for transmission of modulated data using any of a variety of modulation schemes including, but not limited to, amplitude shift keying, phase shift keying, quadrature phase shift keying, quadrature amplitude modulation, and/or amplitude phase shift keying. An example of a direct RF-transmitter using a direct frequency synthesizer in accordance with an embodiment of the invention is illustrated in FIG. 17. As illustrated, a direct-RF transmitter 1700 receives a plurality of input signals 1705 that are input to 'n' serializers/deserializers (SerDes RX) 1710. Each serializer/deserializer 1710 converts data between serial data and parallel interfaces in each direction. The outputs of the SerDes RXs 1710 are provided to a data multiplexer select (Data Mux Sel) 1720, whose outputs are provided to 'n' upconverters 1730. The outputs of the upconverters 1730 are provided to a channel multiplexer select (Chan Mux Sel) 1740. The outputs of the Chan Mux Sel 1740 is provided to an IFFT Upconverter 1750. The output of the IFFT Upconverter 1750 is provided to a 12G digital to analog converter 1760.

BAW resonator 1780 provides a resonant frequency to oscillator 1785, and this is provided as an input to the 12G DAC 1760 and the SerDes RX 1710. Furthermore, I2C and uController 1795 provide outputs to the IFFT Upconverter 1750. Although FIG. 17 illustrates an example circuit architecture for a direct RF-transmitter, any of a variety of different architectures may be utilized as appropriate to the requirements of specific applications in accordance with embodiments of the invention.

Figure 18:
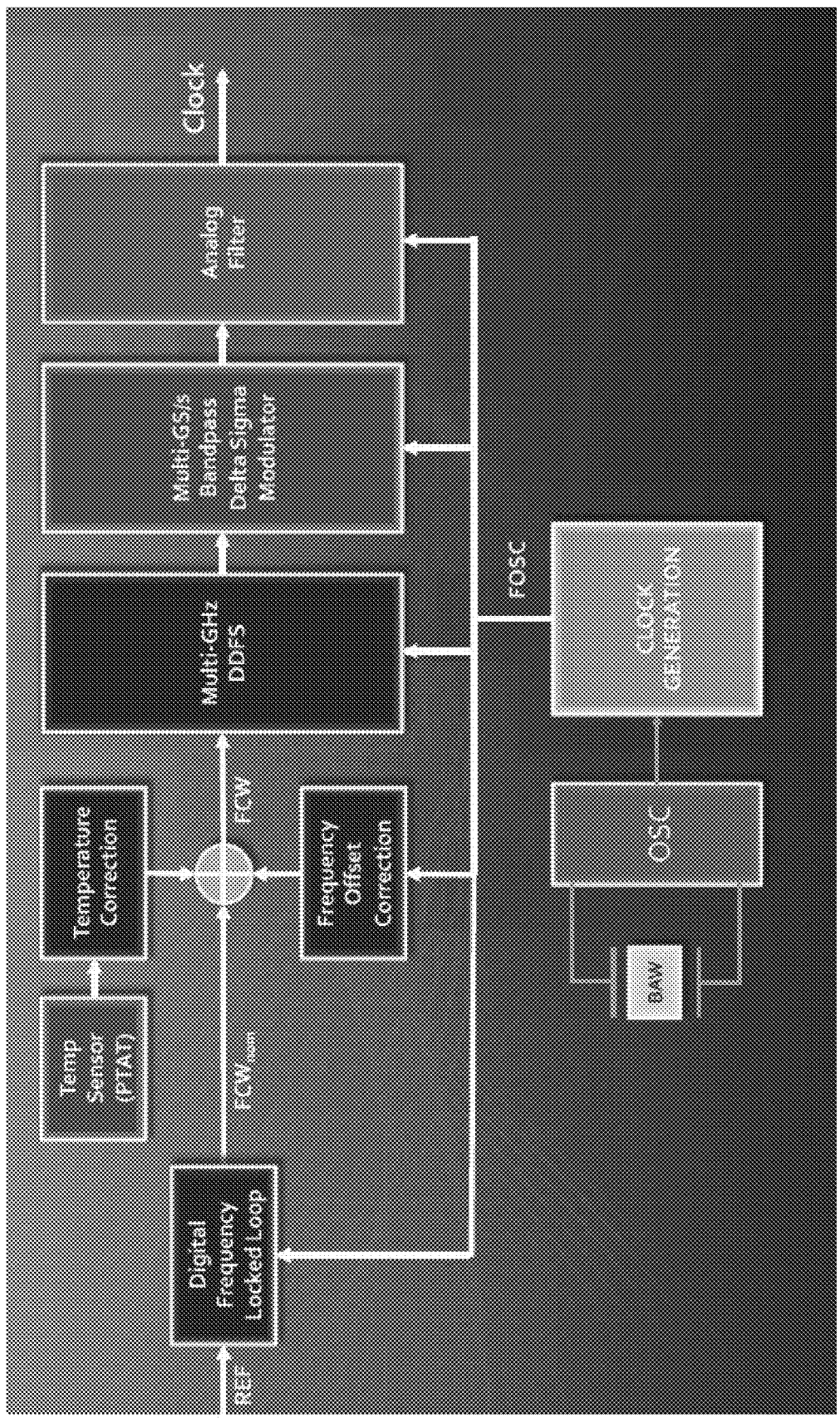
FIG. 18 illustrates a BAW-based digital clock synthesis and Jitter Cleaner/Attenuator in accordance with an embodiment of the invention.
Figure 19:
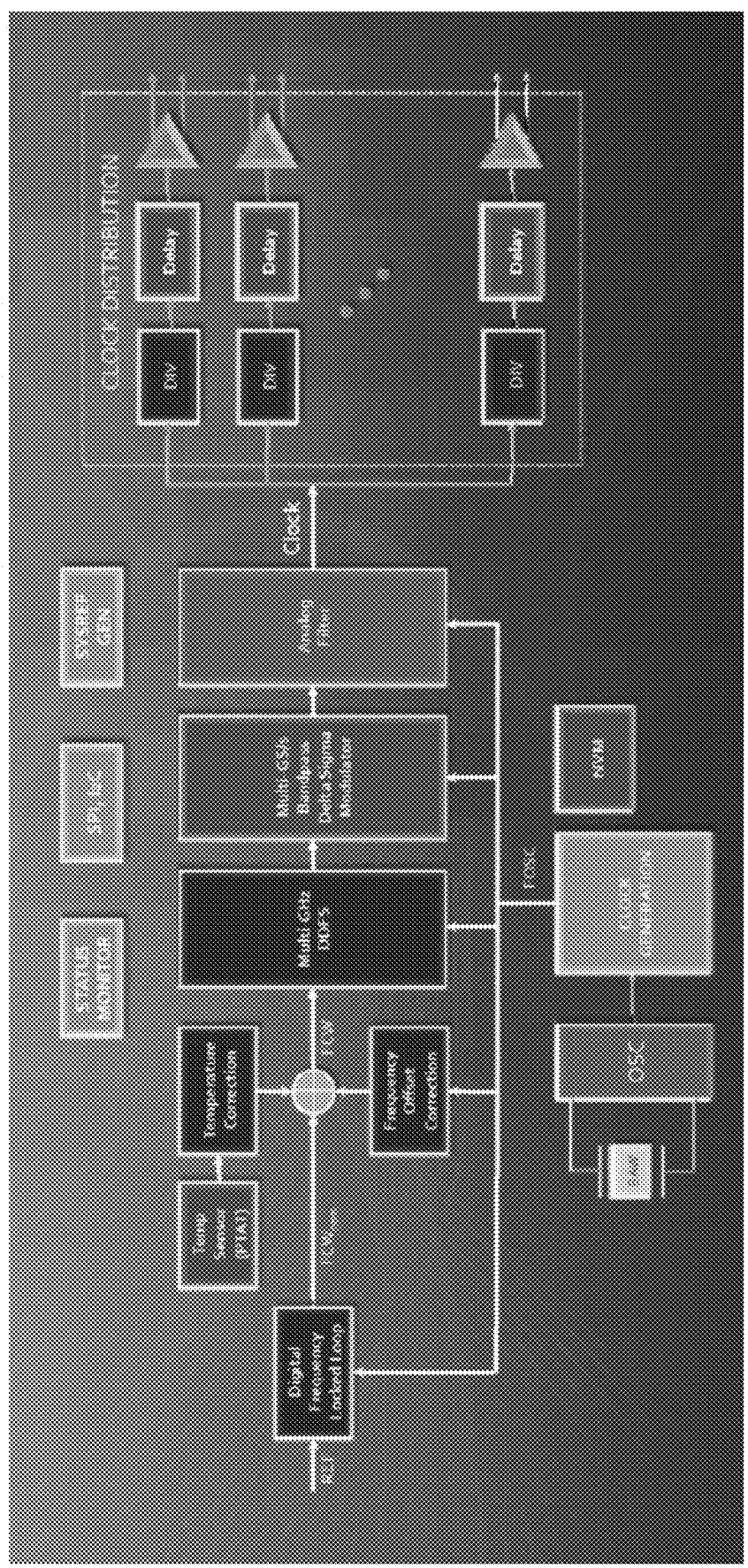
FIG. 19 illustrates a multi-output BAW-based digital clock synthesis and jitter cleaner/attenuator in accordance with an embodiment of the invention.

An example of a BAW-based digital clock synthesizer and jitter cleaner/attenuator using a direct frequency synthesizer in accordance with an embodiment of the invention is illustrated in FIG. 18. An example of a multi-output BAW-based digital clock synthesis and jitter cleaner/attenuator in accordance with another embodiment of the invention is illustrated in FIG. 19.

Although the present invention has been described in certain specific aspects, many additional modifications and variations would be apparent to those skilled in the art. It is therefore to be understood that the present invention may be practiced otherwise than specifically described, including various changes in the implementation. Thus, embodiments of the present invention should be considered in all respects as illustrative and not restrictive.

What is claimed is:

1. A direct frequency synthesizer comprising:
a high speed resonator that generates a frequency signal;
an oscillator that receives the frequency signal and generates an output signal;
a clock generator that receives the output signal of the oscillator and generates a clock signal from the output signal;
a controller that generates a frequency control word describing a desired output digital signal; and
a direct digital frequency synthesizer that receives the clock signal and the frequency control word and generates the desired output digital signal based on the clock signal and frequency control word; and
frequency compensation circuitry that generates a frequency compensation value to adjust for errors in the frequency signal generated by the high speed resonator and adds the frequency compensation value to the frequency control word, wherein the frequency compensation circuitry comprises frequency offset correction circuitry that accounts for resonant frequency offsets in the frequency signal generated by the high speed resonator due to properties of the resonator and provides frequency offset information to the frequency compensation circuitry to generate the frequency compensation value.

2. The direct frequency synthesizer of claim 1 further comprising:
a high speed digital to analog converter that receives the output signal from the oscillator and the desired digital output signal from the direct digital frequency synthesizer and outputs an analog signal based on the desired digital output signal.

3. The direct frequency synthesizer of claim 1 wherein the frequency compensation circuitry comprises:
a temperature sensor that measure an operating temperature; and
wherein the frequency compensation circuitry uses the operating temperature to calculate a correct amplitude value for particular time period to adjust the frequency compensation value.

4. The direct frequency synthesizer of claim 1 wherein the frequency compensation circuitry comprises a non-volatile memory that stores different output signals that may be generated using the direct digital synthesizer that is used in generating the frequency compensation value.

5. The direct frequency synthesizer of claim 1 wherein the frequency compensation circuitry wherein the non-volatile memory outputs an initial frequency error, process information, and a preset frequency to the frequency compensation circuitry.

6. The direct frequency synthesizer of claim 1 wherein the frequency compensation frequency circuitry comprises:
an analog to digital converter that receives the clock signal from the clock generator and a voltage controlled oscillator signal and generates a frequency adjustment value based on the voltage control oscillator signal. Wherein the frequency adjustment value is used to generate the frequency compensation value.

7. The direct frequency synthesizer of claim 1 wherein the high speed resonator is a resonator selected from the group consisting of a bulk acoustic wave (BAW) resonator, a film bulk acoustic resonator (FBAR), a spectral multiband resonator (SMR), and a contour mode resonator (CMR).

8. A method for generating a signal from a high speed resonator comprising:
- generating a frequency signal using a high speed resonator receiving the frequency signal in an oscillator;
- generating an output signal from the frequency signal using the oscillator;
- receiving the output signal of the oscillator in a clock generator;
- generating a clock signal from the output signal of the oscillator using the clock generator;
- generating a frequency control word describing a desired output digital signal using a controller;
- receiving the clock signal and the frequency control word in a direct digital frequency synthesizer; and
- generating the desired output digital signal based on the clock signal and frequency control word using the direct digital frequency synthesizer;
- generating a frequency compensation value to adjust for errors in the frequency signal generated by the high speed resonator using frequency compensation circuitry; and
- adding the frequency compensation value to the frequency control word, wherein the frequency compensation circuitry comprises accounting for resonant frequency offsets in the frequency signal generated by the high speed resonator due to properties of the resonator and providing frequency offset information to the frequency compensation circuitry to generate the frequency compensation value.

9. The method of claim 8 further comprising:
- receiving the output signal from the oscillator and the desired digital output signal from the direct digital frequency synthesizer in a high speed digital to analog converter; and
- converting the desired digital output signal to an analog output signal.

10. The method of claim 8 further comprising:
- measuring an operating temperature using a temperature sensor; and
- calculating a correct amplitude value for particular time period based on the operating temperature to adjust the frequency compensation value using the frequency compensation circuitry.

11. The method of claim 8 further comprising storing different output signals that may be generated using the direct digital synthesizer in the nonvolatile memory for use in generating the frequency compensation value.

12. The method of claim 8 further comprising outputting an initial frequency error, process information, and a preset frequency to the frequency compensation circuitry from the non-volatile memory.

13. The method of claim 8 further comprising:
- receiving the clock signal from the clock generator and a voltage controlled oscillator signal in an analog to digital converter; and
- generating a frequency adjustment value based on the voltage control oscillator signal using the analog to digital converter wherein the frequency adjustment value is used to generate the frequency compensation value.

14. The method of claim 8 wherein the high speed resonator is a resonator selected from the group consisting of a bulk acoustic wave (BAW) resonator, a film bulk acoustic resonator (FBAR), a spectral multiband resonator (SMR), and a contour mode resonator (CMR).

* * * * *